US010290753B2

(12) United States Patent
Guyot-Sionnest et al.

(10) Patent No.: US 10,290,753 B2
(45) Date of Patent: May 14, 2019

(54) MID-INFRARED PHOTODETECTORS

(71) Applicant: The University of Chicago, Chicago, IL (US)

(72) Inventors: Philippe Guyot-Sionnest, Chicago, IL (US); Sean E. Keuleyan, Chicago, IL (US); Emmanuel Lhuillier, Chicago, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 15/062,418

(22) Filed: Mar. 7, 2016

(65) Prior Publication Data

US 2016/0258809 A1  Sep. 8, 2016

Related U.S. Application Data

(63) Continuation of application No. 14/117,064, filed as application No. PCT/US2012/038852 on May 21, 2012, now Pat. No. 9,318,628.

(60) Provisional application No. 61/488,563, filed on May 20, 2011.

(51) Int. Cl.
| | | |
|---|---|---|
| G01J 1/42 | (2006.01) | |
| H01L 31/0296 | (2006.01) | |
| H01L 31/09 | (2006.01) | |
| H01L 31/0352 | (2006.01) | |
| H01L 27/146 | (2006.01) | |
| H01L 31/18 | (2006.01) | |
| C09K 11/89 | (2006.01) | |
| H01L 31/0272 | (2006.01) | |
| H01L 31/032 | (2006.01) | |

(52) U.S. Cl.
CPC .......... H01L 31/0296 (2013.01); C09K 11/89 (2013.01); G01J 1/4228 (2013.01); H01L 27/146 (2013.01); H01L 31/0272 (2013.01); H01L 31/0324 (2013.01); H01L 31/035218 (2013.01); H01L 31/09 (2013.01); H01L 31/1828 (2013.01)

(58) Field of Classification Search
CPC .......................... H01L 31/0296; G01J 1/4228
See application file for complete search history.

(56) References Cited

U.S. PATENT DOCUMENTS

| | | | | |
|---|---|---|---|---|
| 2005/0155641 | A1* | 7/2005 | Fafard .................... | B82Y 10/00 136/249 |
| 2006/0097247 | A1* | 5/2006 | Kim ....................... | B82Y 15/00 257/40 |
| 2008/0206972 | A1* | 8/2008 | Kahen .................... | B82Y 10/00 438/542 |

OTHER PUBLICATIONS

Stiff-Roberts et al., Room-temperature, mid-infrared photodetection in colloidal quantum dot/conjugated polymer hybrid nanocomposites: a new approach to quantum dot infrared photodetectors, J. Phys. D: Appl. Phys. 42, 234004, Nov. 17, 2009, pp. 1-11.

* cited by examiner

*Primary Examiner* — Edwin C Gunberg
(74) *Attorney, Agent, or Firm* — Bell & Manning, LLC

(57) ABSTRACT

Nanoparticles, methods of manufacture, devices comprising the nanoparticles, methods of their manufacture, and methods of their use are provided herein. The nanoparticles and devices having photoabsorptions in the range of 1.7 μm to 12 μm and can be used as photoconductors, photodiodes, phototransistors, charge-coupled devices (CCD), luminescent probes, lasers, thermal imagers, night-vision systems, and/or photodetectors.

13 Claims, 24 Drawing Sheets

MID-INFRARED PHOTODETECTORS

CROSS-REFERENCE TO RELATED APPLICATIONS

The present application is a continuation of U.S. patent application Ser. No. 14/117,064 that was filed Nov. 25, 2013, the entire contents of which are hereby incorporated by reference; which is a National Stage Entry of International Application No. PCT/US12/38852 that was filed May 21, 2012, the entire contents of which are hereby incorporated by reference; which claims priority to U.S. Provisional Patent Application No. 61/488,563 that was filed May 20, 2011, the entire contents of which are hereby incorporated by reference.

STATEMENT OF GOVERNMENT INTEREST

This invention was made with governmental support under grants from the U.S. National Science Foundation (NSF) (DMR-070626) and U.S. Department of Energy (DOE) (DE-FG02-06ER46326). The government has certain rights in the invention.

FIELD OF DISCLOSURE

This invention relates to methods and devices in the field of infrared imaging, more specifically mid-wavelength infrared imaging at a wavelength in a range of 1.7 μm to 12 μm.

BACKGROUND

InSb and HgCdTe are currently the most common materials for mid wavelength infrared detectors. They are both mature material technologies that allow imaging chips called Focal Plane Arrays (FPAs) with good quantum efficiencies, but they remain very expensive and require cooling. Over the past decade, the trend to dual color FPA to improve thermal imaging has increased complexity and cost. As an alternative to bulk materials, wavefunction engineering with epitaxial quantum wells and dots has also been explored with some success.

Colloidal quantum dots could present significant advantages over epitaxial dots. These quantum dots theoretically have a much higher packing density and an improved ease of processing, but the fundamental molecular vibrations of the organic surfactants inherent to the quantum dots are believed to block their applicability. These molecular vibrations, typically above 3 microns, introduce picosecond non-radiative recombination of the infrared electronic excitation. Still further, the large surface to volume ratio in colloidal quantum dot systems, which often induces quenching through unpassivated surfaces suggests their inoperability in mid wavelength detectors.

SUMMARY OF INVENTION

Herein described are nanoparticles, and methods of making the same. Moreover, provided herein are methods of manufacturing nanoparticles, comprising admixing a mercury(II) salt ($Hg^{2+}$) and tellurium ($Te^0$) at a temperature below 100° C. thereby forming HgTe nanoparticles; and isolating the nanoparticles, wherein the nanoparticles comprise mercury and tellurium and have a size sufficient to provide a photoluminescence peak at a wavelength in a range of 1.7 μm to 12 μm.

Further provided herein are methods of manufacturing a device comprising providing the HgTe nanoparticles as described herein; providing a first plurality of electrical connections; and forming a first photoabsorptive layer that comprises the HgTe nanoparticles, has a thickness in a range of 10 nm to 50 μm, 0.05 μm to 25 μm, 0.1 μm to 12.5 μm, or 0.5 μm to 10 μm, and is in contact with the first plurality of electrical connections. The method can further comprise providing a second plurality of electrical connections; and depositing HgTe nanoparticles as a second photoabsorptive layer that comprises an adjacent plurality of the HgTe nanoparticles, an increased conductivity under illumination with light at a wavelength in a range of 1.7 μm to 12 μm, has a thickness in a range of 10 nm to 50 μm, 0.05 μm to 25 μm, 0.1 μm to 12.5 μm, or 0.5 μm to 10 μm, and is in contact with the second plurality of electrical connections; wherein the size of the HgTe nanoparticles deposited in the second photoabsorptive layer differs from the size of the HgTe nanoparticles deposited in the first photoabsorptive layer as indicated by a difference in the corresponding photoluminescent peaks of at least 200 $cm^{-1}$.

Further provided herein are photoconductors, photodiodes, or phototransistors comprising a photoabsorptive layer comprising a plurality of the HgTe nanoparticles; a first electrical connection and a second electrical connection bridged by the photoabsorptive layer; and an increased conductivity from the first electrical connection to the second electrical connection and across the photoabsorptive layer under illumination with light at a wavelength in a range of 1.7 μm to 12 μm.

Also provided are devices comprising a plurality of the photoconductors, photodiodes, or phototransistors as described herein; and a readout circuit electrically connected to the plurality of the photoconductors, photodiodes, or phototransistors. The plurality of photoconductors, photodiodes, or phototransistors can comprise a first plurality of photoconductors, photodiodes, or phototransistors and a second plurality of photoconductors, photodiodes, or phototransistors; and wherein a photoluminescence peak frequency of the HgTe nanoparticles of the first plurality is different from a photoluminescence peak frequency of the HgTe nanoparticles of the second plurality.

Further provided herein are charge-coupled device (CCD) photodetectors comprising a first region that comprises a plurality of the first photoconductors, photodiodes, or phototransistors, a second pixel region that comprises a plurality of the second photoconductors, photodiodes, or phototransistors, and a pixel circuit for each pixel region, each pixel circuit including a cathode layer and an anode layer and further comprising a charge store and a read out circuit. The photodetector can further comprise circuitry that includes the pixel circuits configured to measure a photoresponsive current through each pixel region over a period of time.

Also provided herein are methods of producing an image comprising providing a device, as described herein, exposing the device to light at wavelengths absorbed by the HgTe nanoparticles disclosed herein to provide a photoresponsive current, and rendering the photoresponsive current as an image or image data file.

BRIEF DESCRIPTION OF THE FIGURES

For a more complete understanding of the disclosure, reference should be made to the following detailed description and accompanying drawing figures wherein.

Figure 1:
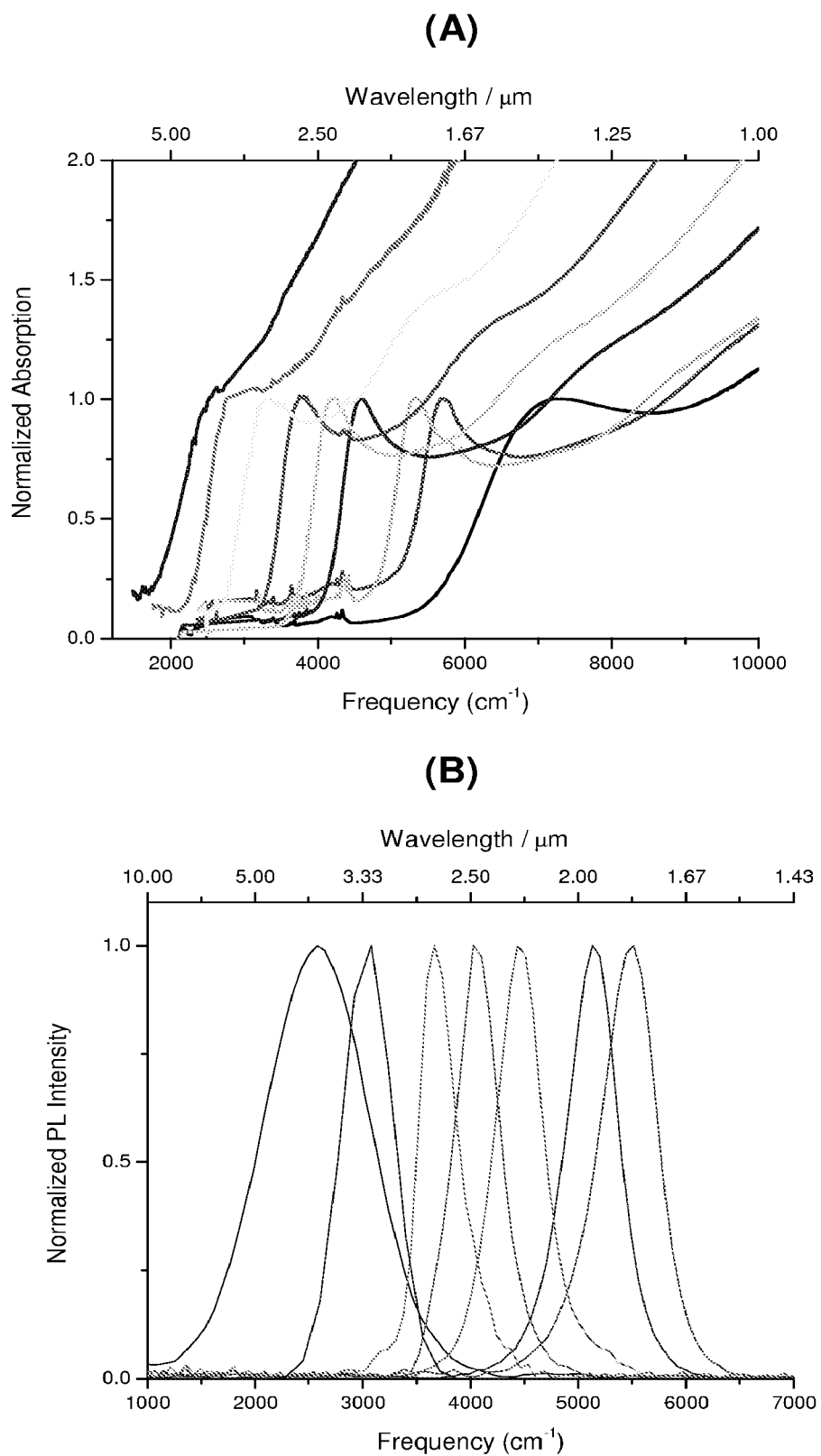
FIG. 1 is plots of absorbance and photoluminescence for various HgTe nanoparticles.

While the disclosed compositions, method and apparatus are susceptible of embodiments in various forms, there are illustrated in the examples and figures (and will hereafter be described) specific embodiments, with the understanding that the disclosure is intended to be illustrative and is not intended to limit the invention to the specific embodiments described and illustrated herein.

DETAILED DESCRIPTION

Herein are described materials, methods and apparatus with nanoparticle materials that exhibit photoabsorptions at frequencies greater than 2000 cm$^{-1}$. These materials and the methods and apparatus that employ them exhibit photoabsorptions in the mid-infrared (mid-IR) region of the electromagnetic spectrum, in some cases, in the atmospheric mid-IR transparency window between 3 μm and 5 μm.

In various embodiments, the materials, methods, and apparatus of the current disclosure include nanoparticles having a discrete size and shape. Herein, nanoparticles include, but are not limited to, nanocrystals, nanorods, nanowires, and the like. Nanoparticles generally refers to a particle that exhibits one or more properties not normally associated with a corresponding bulk material (e.g., quantum optical effects). The term also generally refers to materials having at least two dimensions that do not exceed about 1000 nm. In various embodiments described herein, these dimensions are even smaller. Typically, nanocrystals have three dimensions that do not exceed 1000 nm, herein, and, in some cases, do not exceed 500 nm, or more preferably do not exceed 250 nm, 100 nm, 50 nm, or 25 nm. Typically, the nanocrystals can have an average diameter in a range of about 1 nm to about 25 nm, about 5 nm to about 15 nm, or about 7 nm to about 11 nm.

The nanoparticles have a size sufficient to provide a photoluminescence peak at a frequency greater than 2000 cm$^{-1}$. The nanoparticle can have a size sufficient to provide a photoluminescence peak in the range of 2000 cm$^{-1}$ to 6000 cm$^{-1}$. In some embodiments, the nanoparticles comprise HgTe and have a size sufficient to provide a photoluminescence peak at a frequency between 2000 cm$^{-1}$ and 6000 cm$^{-1}$. In various embodiments, the nanoparticles have a size sufficient to provide a photoluminescence peak at a wavelength in a range of 1.7 μm to 12 μm, 2 μm to 6 μm, 3 μm to 5 μm, 7 to 12 μm, or 8 to 11 μm.

A measure of the uniformity of nanoparticle size is obtained by the measurement of the photoluminescent peak's width at half height. In various cases, the herein disclosed nanoparticles have a low size dispersity (e.g., nearly monodisperse or monodisperse). The photoluminescence peak of certain embodiments of the herein disclosed nanoparticles has a peak width at half height less than 1000 cm$^{-1}$, less than 750 cm$^{-1}$, or less than 500 cm$^{-1}$. The peak width at half height can be in a range of 50 cm$^{-1}$ to 800 cm$^{-1}$, 100 cm$^{-1}$ to 700 cm$^{-1}$, or 400 cm$^{-1}$ to 600 cm$^{-1}$.

In various embodiments, the nanoparticles disclosed herein have a size sufficient to provide an absorption edge at a wavelength in a range of 1.7 μm to 12 μm, 2 μm to 6 μm, 3 μm to 5 μm, 7 to 12 μm, or 8 to 11 μm. For example, see FIG. 1(A) that shows a series of herein described HgTe nanoparticles having an absorption edge at wavelengths in a range of about 1.7 μm to about 5 μm.

The nanoparticles can have a cap, capping ligand, or passivation layer that can provide solubility, stability, quantum confinement, or reactivity to the underlying nanocrystal. Herein, the terms nanoparticle and nanocrystal expressly include the cap, capping layer, or passivation layer unless an express statement distinguishes between the underlying nanocrystal and the cap, capping ligand, or passivation layer.

In various embodiments, the underlying nanocrystal comprises a mercury(II)-containing nanocrystal. In some embodiments, the mercury containing nanocrystal includes a chalcogenide, e.g., selenium, tellurium, or a mixture thereof. In various embodiments, the nanocrystal is a mercury telluride nanocrystal (HgTe). In various embodiments, the nanocrystal is a mercury selenide nanocrystal (HgSe). In some embodiments, the nanocrystal is a core/shell nanocrystal, for example, a nanocrystal that includes a HgTe core and a CdTe shell (HgTe/CdTe). Alternative core and shell arrangements can also be used (for example, HgTe/HeSe or HgTe/CdHgTe). In some cases, the shell does not include a chalcogenide that exchanges with the tellurium of the core which would quench some or all of the photoabsorption in the mid-IR region.

The cap, capping ligand, or passivation layer can be an organic fragment or an inorganic fragment. The organic fragment can, for example, be selected from the group consisting of alkylamines, alkylthiols, alkylselenol, alkylphosphine, alkylphosphine oxide, alkylphosphine sulfide, alkylphosphine selenide, alkylphosphine telluride, and mixtures thereof. In one embodiment, these organic fragments are understood to encompass both the protonated and unprotonated forms, where appropriate. An example of the protonated form is dodecantethiol (RSH); an example of the deprotonated form is dodecanesulfide (RS$^-$). The inorganic fragment can, for example, be selected from $As_3^{3-}$, $As_4^{2-}$, $As_5^{3-}$, $As_7^{3-}$, $As_{11}^{3-}$, $AsS_3^{3-}$, $As_2Se_6^{3-}$, $As_2Te_6^{3-}$, $As_{10}Te_3^{2-}$, $Au_2Te_4^{2-}$, $Au_3Te_4^{3-}$, $Bi_3^{3-}$, $Bi_4^{2-}$, $Bi_5^{3-}$, $Bi_7^{3-}$, $GaTe^{2-}$, $Ge_9^{2-}$, $Ge_9^{4-}$, $Ge_2S_6^{4-}$, $HgSe_2^{2-}$, $Hg_3Se_4^{2-}$, $In_2Se_4^{2-}$, $In_2Te_4^{2-}$, $Ni_5Sb_{17}^{4-}$, $Pb_5^{2-}$, $Pb_7^{4-}$, $Pb_9^{4-}$, $Pb_2Sb_2^{2-}$, $Sb_3^{3-}$, $Sb_4^{2-}$, $Sb_7^{3-}$, $SbSe_4^{3-}$, $SbSe_4^{5-}$, $SbTe_4^{5-}$, $Sb_2Se_3^-$, $Sb_2Te_5^{4-}$, $Sb_2Te_7^{4-}$, $Sb_4Te_4^{4-}$, $Sb_9Te_6^{3-}$, $Se_2^{2-}$, $Se_3^{2-}$, $Se_4^{2-}$, $Se_{5,6}^{2-}$, $Se_6^{2-}$, $Sn_4^{2-}$, $Sn_5^{2-}$, $Sn_9^{3-}$, $Sn_9^{4-}$, $SnS_4^{4-}$, $SnSe_4^{4-}$, $SnTe_4^{4-}$, $SnS_4Mn_2^{5-}$, $Sn_2S_6^{4-}$, $Sn_2Se_6^{4-}$, $Sn_2Te_6^{4-}$, $Sn_2Bi_2^{2-}$, $Sn_8Sb^{3-}$, $Te_2^{2-}$, $Te_3^{2-}$, $Te_4^{2-}$, $Tl_2Te_2^{2-}$, $TlSn_8^{3-}$, $TlSn_8^{5-}$, $TlSn_9^{3-}$, $TlTe_2^{2-}$, and a mixture thereof.

In some embodiments, HgTe nanoparticles as described herein are made at low temperatures (below about 100° C.) useing tellurium(0). The method includes admixing a mercury(II) salt (Hg$^{2+}$) and tellurium (Te$^0$) at a temperature below about 100° C. thereby forming the nanoparticles in the resulting reaction mixture; and then isolating the nanoparticles from the reaction mixture. As described above, the resulting nanoparticles have a size sufficient to provide a photoluminescence peak at a frequency greater than 2000 cm$^{-1}$.

The method can further comprise admixing the tellurium with a trialkylphosphine. Herein, the phosphine telluride is considered a form of Te(0). Alternatively and as understood by one of ordinary skill, the methods can include admixing a mercury(II) salt (Hg$^{2+}$), tellurium(II) (Te$^{2+}$), and a pentavalent phosphine (P$^{5+}$). The method can further include admixing the tellurium with an excess of trialkylphosphine, wherein an excess is determined by a molar ratio (moles trialkylphosphine/moles Te) of greater than 1; for example the molar ratio can be in the range of 1 to 10, 1.5 to 7.5, or 2 to 5.

The trialkylphosphine can have a range of carbon atoms, the range including from 3 to 60 carbon atoms, from 6 to 36 carbon atoms, or from 12 to 30 carbon atoms. Examples of contemplated trialkylphosphines include but are not limited to triethylphosphine, tributylphosphine, tripentylphosphine, trihexylphosphine, trioctylphosphine, and tridecylphosphine.

The admixing of the mercury(II) salt (He$^{2+}$) and tellurium (Te$^0$) can include injecting a mercury solution into a tellurium solution. The method can further include preparing a tellurium solution or preparing a mercury solution prior to admixing. In various cases, the tellurium or tellurium solution just prior to admixture with the mercury or mercury solution is at a temperature in a range of about 0° C. to about 90° C. Preparing the tellurium solution can include admixing the tellurium and the trialkylphosphine. Preparing the mercury solution can include dissolving a mercury salt in a nitrogen base (e.g., pyridine), a mercury salt with a nitrogen base in a solvent, or dissolving a mercury amine salt in a solvent. Contemplated solvents include butanol, pentanol, hexanol, heptanol, octanol, nonanol, decanol, dodecanol, and combinations thereof.

In some embodiments, the method of making nanoparticles as disclosed herein includes a reaction mixture that is substantially free of an alkane thiol. As used here, substantially free means that the molar concentration of alkane thiol in the reaction mixture is less than 10%, less than 5%, less than 3%, or less than 1% of the molar concentration of the mercury salt in the reaction mixture. In some cases, there is less than 0.5% or no alkane thiol in the reaction mixture.

Isolating the nanoparticles from the reaction mixture can include admixing a thiol with the reaction mixture thereby forming a quenched mixture; and then extracting the nanoparticles from the quenched mixture. The thiol can be an alkane thiol, having between 6 and 30 carbon atoms, for example, hexane thiol, octane thiol, decane thiol, dodecane thiol, hexadecane thiol, eicosanethiol, or a combination thereof.

Isolating the nanoparticles from the reaction mixture can include admixing the reaction mixture with a precipitation solvent in which the nanoparticles are insoluble or sparingly soluble (e.g., have an appreciably low solubility) and/or centrifuging the reaction mixture or the quenched mixture to yield isolated nanoparticles. The isolated nanoparticles can be washed and/or redispersed in a solvent, e.g., tetrachloroethylene. The redispersed nanoparticles can be precipitated from the solution by the addition of a precipitating agent, that is, an agent that causes the precipitation of the nanoparticles, e.g., acetonitrile or methanol. The isolated then precipitated nanoparticles can again be dispersed in a suitable solvent for the preparation of devices that include the nanoparticle.

Figure 4:
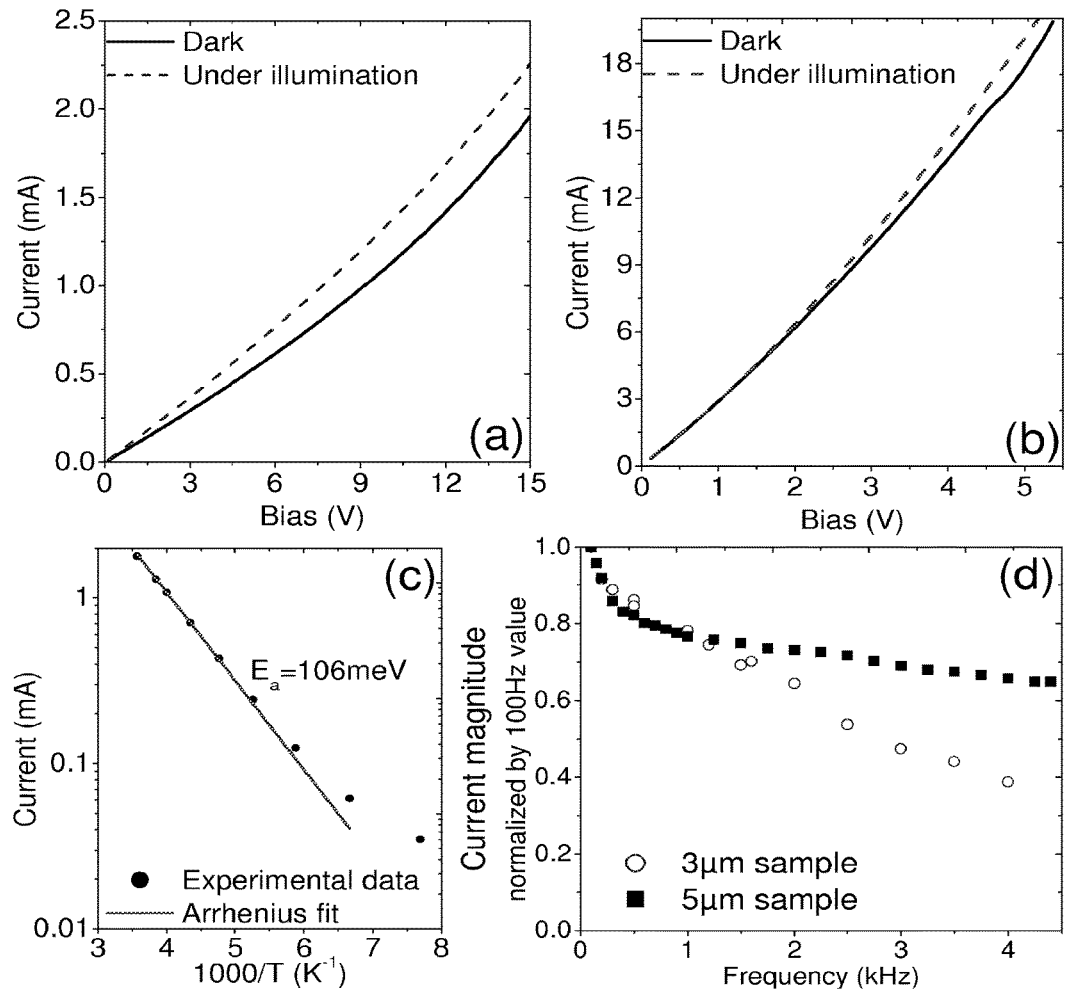
FIG. 4 Room temperature IV curves for the 3 µm (a) and 5 µm (b) samples in the dark (solid) and under illumination (dashed). (c) Dark current for the 5 µm sample as a function of temperature with an Arrhenius fit and 106 meV activation energy. (d) Normalized photocurrent as a function of frequency.

In various embodiments, the HgTe nanoparticles can be used in a photoconductor, photodiode, or phototransistor device. The photoconductor, photodiode, or phototransistor includes a photoabsorptive layer comprising an adjacent plurality of the HgTe nanoparticles, as described above; a first electrical connection and a second electrical connection bridged by the photoabsorptive layer; and an increased conductivity from the first electrical connection to the second electrical connection and across the photoabsorptive layer under illumination with light at a wavelength in a range of 1.7 µm to 12 µm. As shown in FIGS. 4(*a*) and 4(*b*), the herein described photoilluminated nanoparticles have an increased conductivity over the dark current. Further, the responsivity increases as a function of the applied bias, see e.g., FIG. 7. In some cases, the photoabsorptive layer of the photoconductor, photodiode, or phototransistor has a thickness in a range of 15 nm to 10 µm.

As used herein, increased conductivity is proportional to the product of the material's (e.g., nanoparticle, matrix including the nanoparticle, film, or layer) electrical mobility and carrier concentration. The carrier concentration is herein influenced by the addition of irradiation at a wavelength sufficient to cause the formation of electron/hole pairs.

The photoconductor, photodiode, or phototransistor device can include a plurality of photoconductors, photodiodes, or phototransistors, and a readout circuit electrically connected to the plurality of the photoconductors, photodiodes, or phototransistors. In some cases, the plurality of photoconductors, photodiodes, or phototransistors comprises a first plurality of photoconductors, photodiodes, or phototransistors and a second plurality of photoconductors, photodiodes, or phototransistors; and wherein a photoluminescence peak frequency of the HgTe nanoparticles of the first plurality is different from a photoluminescence peak frequency of the HgTe nanoparticles of the second plurality. In one aspect, the difference between the photoluminescence peak frequencies is at least 100 cm$^{-1}$.

In various embodiments, the photoconductor, photodiode, or phototransistor device can be selected from the group consisting of a charge-coupled device (CCD), a luminescent probe, a laser, and a photodetector.

In various embodiment, the photoconductor, photodiode, or phototransistor device further includes a charge store and a read out circuit, and which in some cases are individually connected to each photoconductor, photodiode, or phototransistor. Optionally, the photoconductor, photodiode, or phototransistor device further includes circuitry configured to measure a photoresponsive current through each photoconductor, photodiode, or phototransistor over a period of time.

In some embodiments, the device comprises a first cathode layer; the cathode layer electronically coupled to a first photoabsorptive layer that comprises the HgTe nanoparticles, described above, and the first photoabsorptive layer electronically coupled to a first anode layer. The first photoabsorptive layer can have a thickness in a range of 10 nm to 50 μm; 0.05 μm to 25 μm; 0.1 μm to 12.5 μm; or 0.5 μm to 10 μm. Furthermore, the first photoabsorptive layer can comprise a plurality of adjacent HgTe nanoparticles arranged in an orientation that includes a minimum spacing between adjacent HgTe nanoparticles; the orientation of the HgTe nanoparticles being sufficient to provide a prolonged photoexcitation of the HgTe nanoparticle and result in a photoresponsive current.

In various embodiments, the device also includes a second cathode layer coupled to a second photoabsorptive layer that comprises HgTe nanoparticles, and the second photoabsorptive layer is electronically coupled to a second anode layer. Notably, the size of the HgTe nanoparticles of the second photoabsorptive layer can be different from the size of the HgTe nanoparticles of the first photoabsorptive layer. The size difference is indicated by a difference in the photoluminescent peaks corresponding to the HgTe nanoparticles in the respective photoabsorptive layers. In some cases, the device further comprises a second photoabsorptive layer that has a thickness in a range of 10 nm to 50 μm; 0.05 μm to 25 μm; 0.1 μm to 12.5 μm; or 0.5 μm to 10 μm. The photoluminescence peak and peak width are determined from the respective photoabsorptive layer.

In various embodiments, the device can be manufactured with the HgTe nanoparticles and a first plurality of electrical connections, by forming a first photoabsorptive layer that comprises the HgTe nanoparticles and has a thickness in a range of 10 nm to 50 μm; 0.05 μm to 25 μm; 0.1 μm to 12.5 μm; or 0.5 μm to 10 μm in contact with the first plurality of electrical connections. As noted above, the HgTe nanoparticles can have a size sufficient to provide a photoluminescence peak at a frequency between 2000 cm$^{-1}$ and 6000 cm$^{-1}$ with a peak width at half height in a range of 100 cm$^{-1}$ to 1000 cm$^{-1}$, a range of 200 cm$^{-1}$ to 800 cm$^{-1}$, or in a range of 300 cm$^{-1}$ to 700 cm$^{-1}$. Additionally, the first photoabsorptive layer can comprise an adjacent plurality of the HgTe nanoparticles and an increased conductivity (between the electrical connections) under illumination with light at a wavelength in a range of 1.7 μm to 12 μm.

In various embodiments, the device can be manufactured, with a plurality of second electrical connections, by depositing HgTe nanoparticles as a second photoabsorptive layer that comprises an adjacent plurality of the HgTe nanoparticles, an increased conductivity under illumination with light at a wavelength in a range of 1.7 μm to 12 μm, has a thickness in a range of 10 nm to 50 μm; 0.05 μm to 25 μm; 0.1 μm to 12.5 μm; or 0.5 μm to 10 μm, and is in contact with the second plurality of electrical connections. The size of the HgTe nanoparticles deposited in the second photoabsorptive layer can differ from the size of the HgTe nanoparticles deposited in the first photoabsorptive layer as indicated by a difference in the corresponding photoluminescent peaks of at least 200 cm$^{-1}$.

In some embodiments, the method of manufacturing the device excludes annealing the deposited HgTe nanoparticles. Annealing comprises heating the HgTe nanoparticle to a temperature above about 100° C.

The herein described devices can be used in a variety of applications depending on the organization of the photodiodes and phototransistors. In some embodiments, the device is used to produce or store an image; the method includes providing a device, as described above, exposing the device to light at wavelengths absorbed by the HgTe nanoparticles to provide a photoresponsive current; and rendering the photoresponsive current as an image or image data file.

Regarding the HgTe nanoparticles, FIG. 1 shows the absorption spectra of solutions of HgTe nanoparticles in tetrachloroethylene from the near-IR to the mid-IR. The absorption spectra also show the hydrocarbon vibrational absorption, around 3.4 μm, which arises from the dodecanethiol ligands and remains of similar magnitude to the dot electronic absorption.

Figure 2:
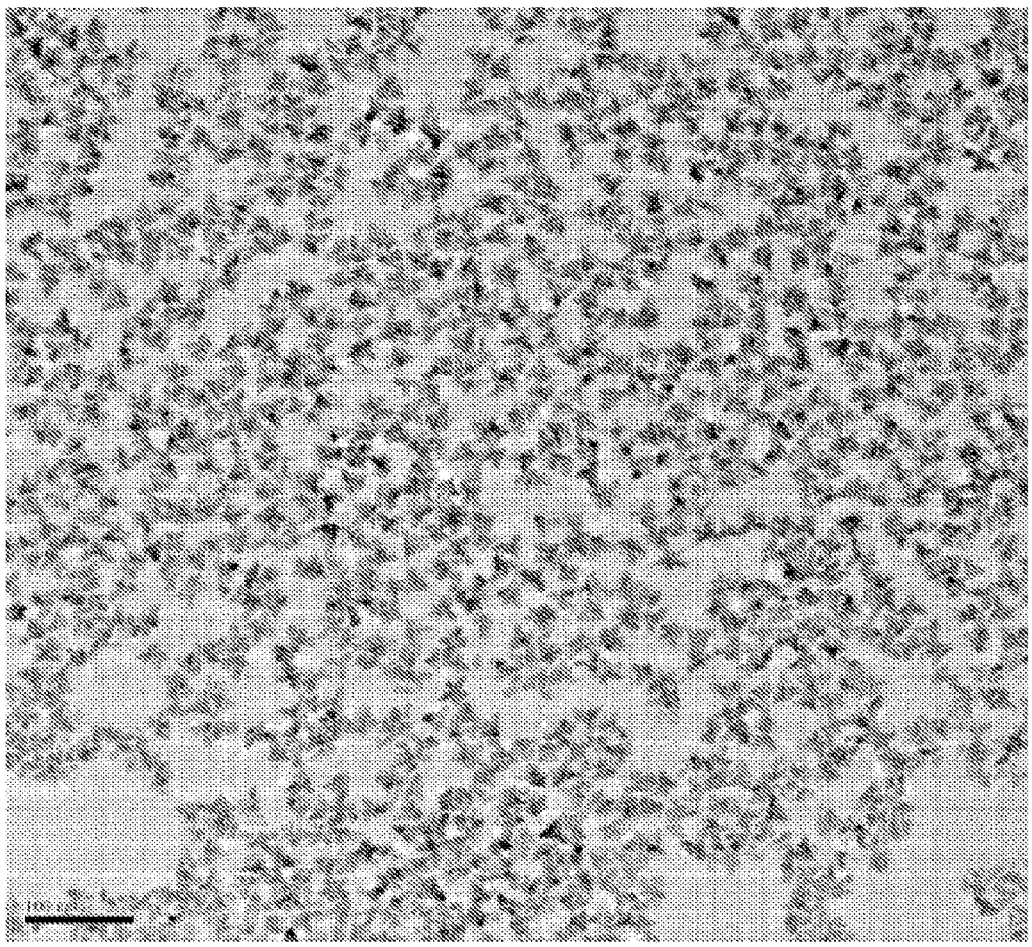
FIG. 2 is a TEM image of a monodisperse sample having an exciton absorption peak near 4 µm.
Figure 3:
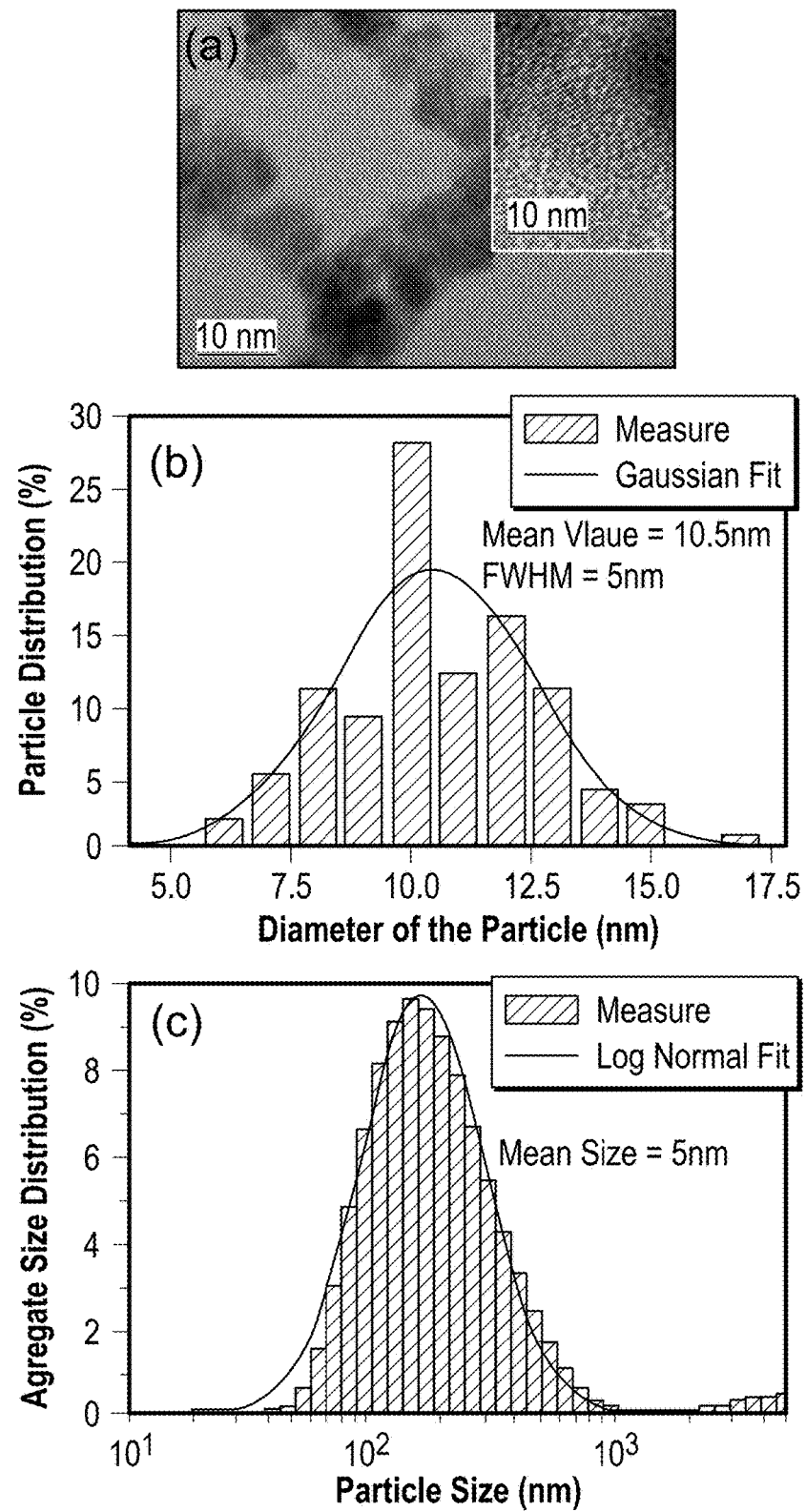
FIG. 3 (a) TEM image of exemplary HgTe material. Scale bar is 10 nm. The inset shows a high resolution image of a single dot. (b) Diameter distribution of single dots for the sample shown in (a) (c) Hydrodynamic radii distribution in solution obtained by dynamic light scattering (DLS), and a log normal fit of the distribution with a 220 nm mean value.

Although the absorption edge implies quantum confinement, Dynamic Light Scattering (DLS) indicates partial aggregation of the nanoparticles in the solution. Aggregation in an extended necklace structure is also seen in TEM images shown in FIGS. 2 and 3. Nevertheless, particles are distinguishable. In one example, a sample had a diameter of 10.5±2.5 (σ) nm diameter and an absorption edge just past 5 μm, and, in another example, a sample had a diameter of 7.1±1.0(σ) nm and absorbed to just beyond 3 μm. Films prepared from these solutions of these particles are herein referred to as "5 μm" and "3 μm" samples respectively. In FIG. 3, the inset shows interference fringes with a 3.7 Å interplanar distance, consistent with the spacing along the (111) direction of the zinc blende structure with a 6.46 Å HgTe unit cell parameter.

The particle aggregation, which, without wishing to be bound by theory, is thought to arise from the synthetic scheme, plays a beneficial role by providing electronic coupling between particles. In contrast to typical drop-cast colloidal quantum dot (CQD) films where ligand exchange or sintering is essential to achieve conductivity, the HgTe dot films disclosed herein are readily conductive without any treatment. As shown in FIG. 4a, films show nearly linear IV curves in the dark as well as under illumination ($10^{16}$-$10^{17}$ photon s$^{-1}$), at room temperature. For a 3 μm sample film, with a thickness of 300 nm, the dark conductivity σ≈$10^{-4}$ Scm$^{-1}$, while for a 5 μm sample with a thickness of 450 nm, the dark conductivity is 1.3×$10^{-3}$ Scm$^{-1}$.

Figure 5:
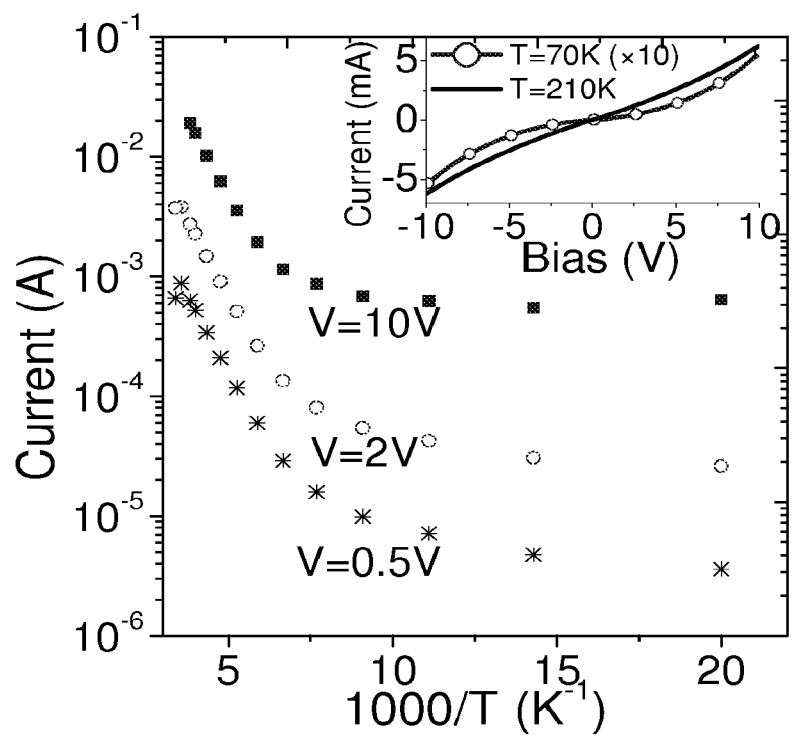
FIG. 5 Dark current for an exemplary sample, as a function of the inverse of the temperature, for three different biases. The inset shows the I(V) curve for the sample for two different temperatures.
Figure 9:
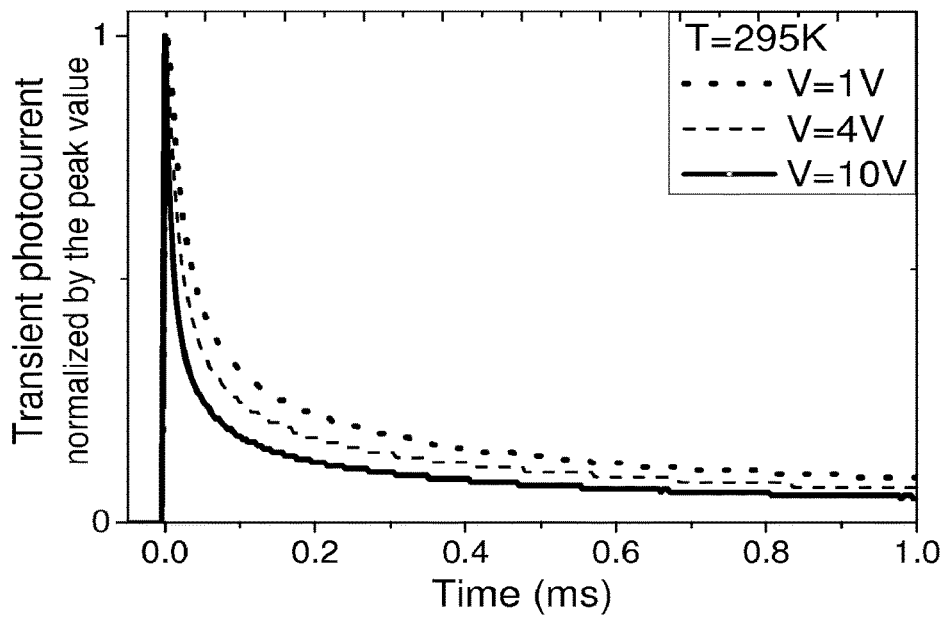
FIG. 9 Transient photocurrent for a 3 µm sample at room temperature, for three different biases. The transient photoresponse was measured by illuminating the sample with a 10 ps 1064 nm Nd:Yag pulsed laser. There are fast and slow decay components. The transients become faster with higher bias. Additional results not depicted in the figure show effects of the film thickness on the transient response, with faster response for thicker films.

As shown in FIG. 4b and FIG. 5, the dark current is thermally activated. The activation energies are 106±10 meV for the 5 μm sample and 201±20 meV for the 3 μm sample, and close to half of the optical gaps just as for intrinsic semiconductors. Without being bound by theory, the thermally activated conductance is believed to come primarily from the thermal creation of carriers, which is possible in such narrow gap materials. Within the intrinsic regime, the number of carriers of a given sign per dot should be n≈$(n_e n_h)^{1/2}$ exp($-E_g/2$ kT) where $n_e$ and $n_h$ are the number of electron and hole states thermally accessible per dot. Taking $n_e=n_h=2$ for the non degenerate S states, and $E_g=400$ meV for the 3 micron sample, gives n~$10^{-3}$ at 300K. With a close packed dot density estimated as N~5×$10^{18}$ cm$^{-3}$, a mobility $\mu \approx \sigma/Nne \sim 10^{-1}$ cm$^2$V$^{-1}$s$^{-1}$ is then obtained, where e is the elementary electric charge. For such a simply drop-cast film, this is an unexpectedly high mobility value and, without being bound by theory, is thought to reflect the partial aggregation discussed above. This mobility is an averaged value for the disordered material and additional states will increase the carrier density and reduce the estimate. The photocurrent as a function of chopper frequency is given in the range of 0.1-4.4 kHz in FIG. 4(*d*). In this range, the response decreases only slightly. Transient photocurrent following a 10 ps 1064 nm pulse is provided in FIG. 9.

Figure 6:
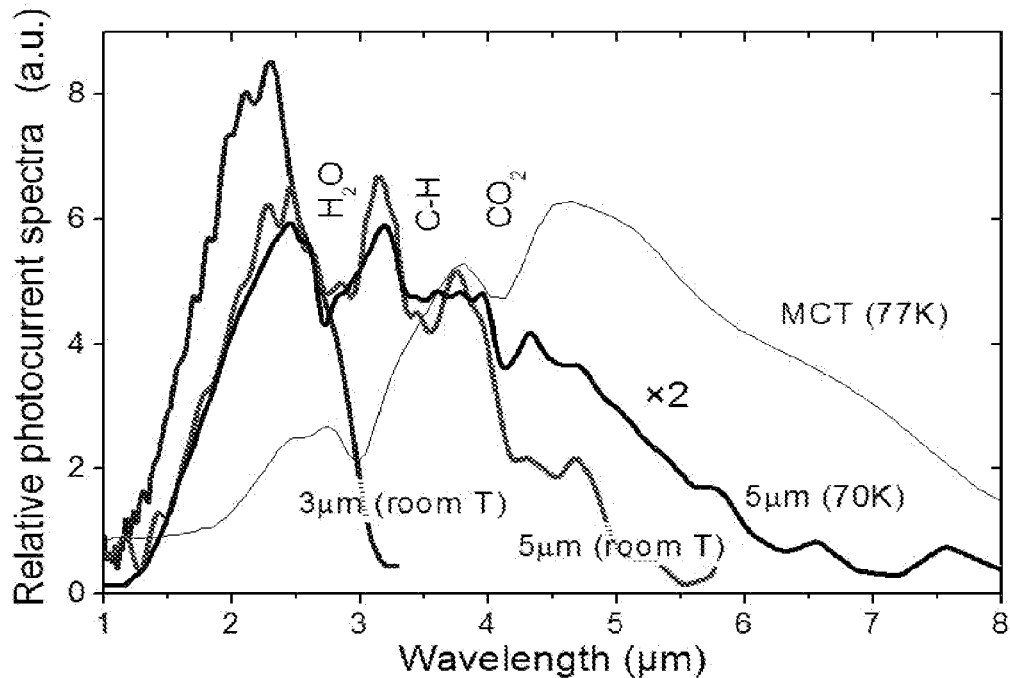
FIG. 6 Fourier transforms of the interferograms measured for the two devices under identical conditions with 0.3 V bias, at noted sample sizes and temperatures. Features at 4.1 and 2.8 µm are due to $CO_2$ and $H_2O$ in the beam path. The feature at 3.4 microns is due to the ligand absorption.
Figure 10:
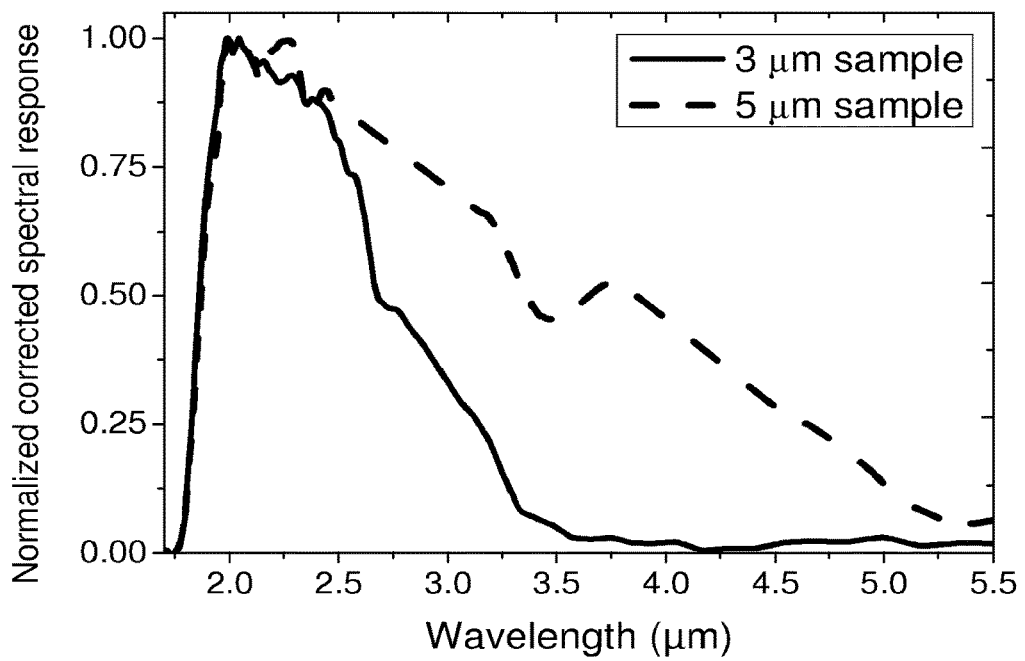
FIG. 10 Relative spectral response of the two samples at room temperature normalized by the MCT spectral response at liquid nitrogen temperature. The short wavelength cut-off is due to the Ge filter. By normalizing the measured photoresponse such as is shown in FIG. 6, with that of a liquid nitrogen cooled commercial MCT detector (Kolmar Technology, 1 mm² area) and using its specified spectral responsivity, a relative spectral responsivity shown in FIG. 7 is obtained. The accuracy of this procedure is limited due to the different detector areas.
Figure 11:
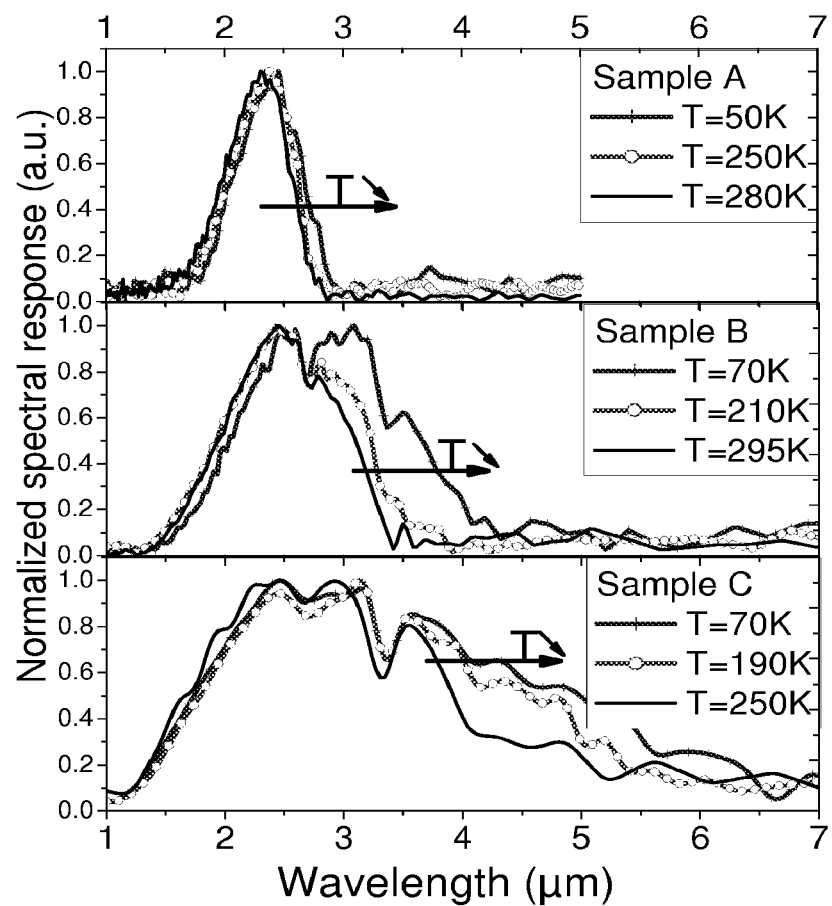
FIG. 11 Normalized spectral response for three samples varying in particle size, samples A (top), B (middle) and C (bottom), for different temperatures of the detector. These spectra were acquired while the samples were respectively biased by 2 V, 1 V and 0.3 V.
Figure 12:
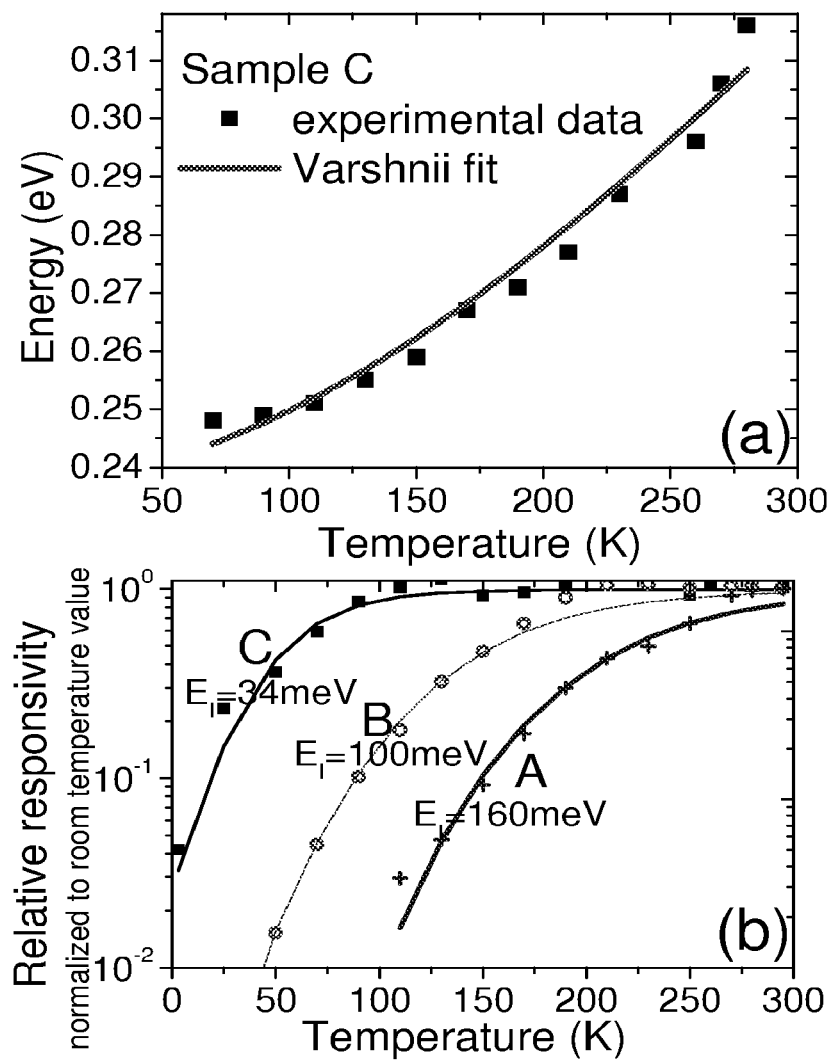
FIG. 12 (a) Position of the long-wavelength half maximum of the spectral response as a function of the temperature for an exemplary sample. (b) Relative responsivity (integral of the photocurrent spectrum), normalized to the room temperature value as a function of temperature for samples A, B and C. The solid lines are associated fit as discussed in the text.
Figure 13:
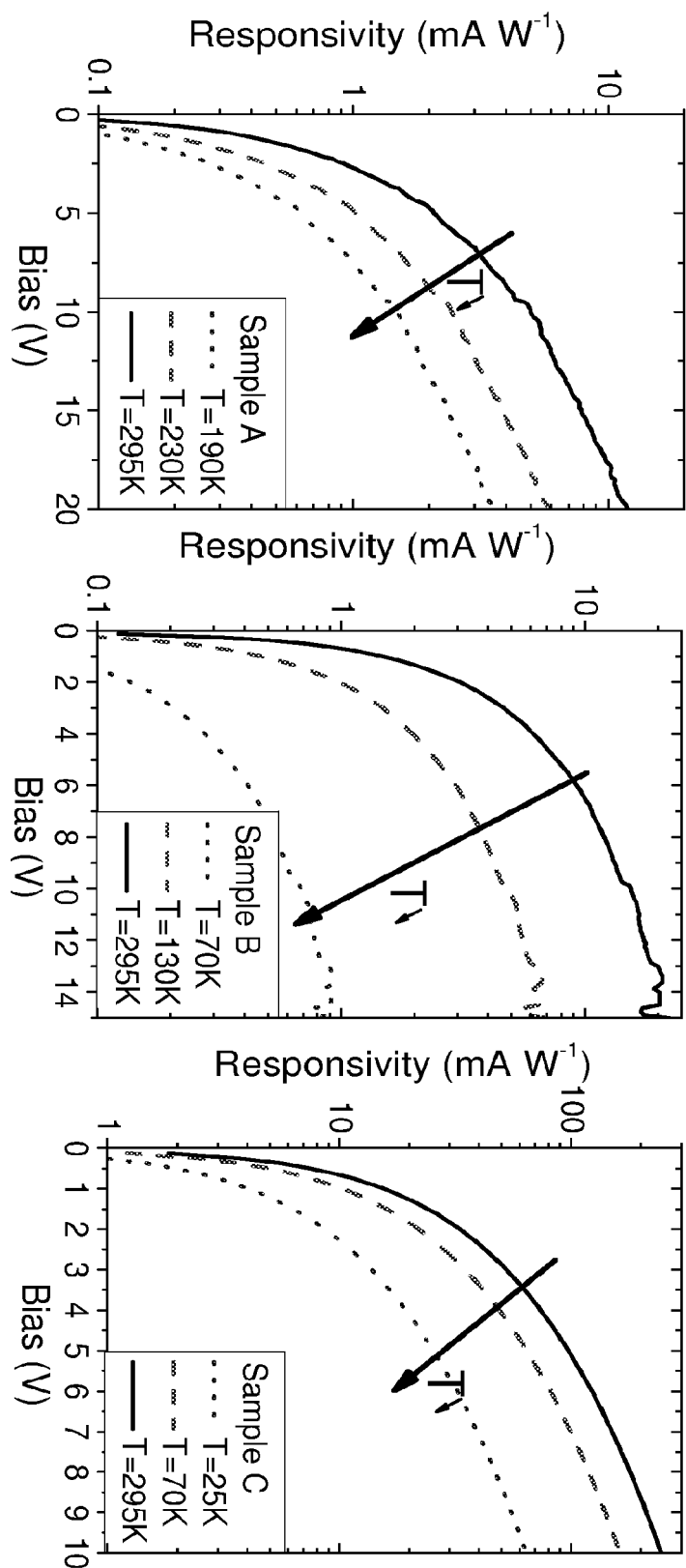
FIG. 13 Responsivity for samples A, B and C as a function of the applied bias for different temperature.
Figure 14:
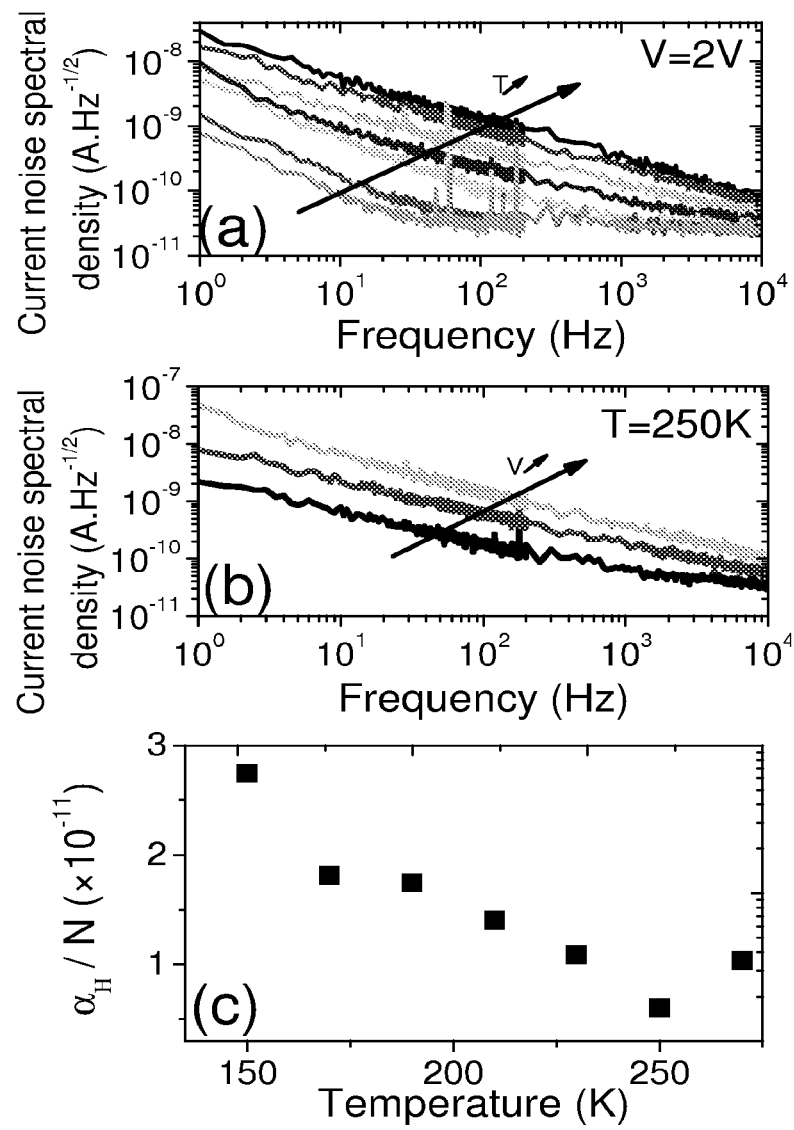
FIG. 14 (a) Current noise spectral density for a 2 V bias at temperatures: 70, 110, 150, 190, 230, 250 and 295K for sample C. (b) Current noise spectral density at 250K at applied bias: 0.5, 2 and 5 V for sample C. (c) Ratio of the $\alpha_H$ Hooge's parameter over the number of carriers as a function of the detector temperature at 10 V for sample C at 10 Hz.
Figure 15:
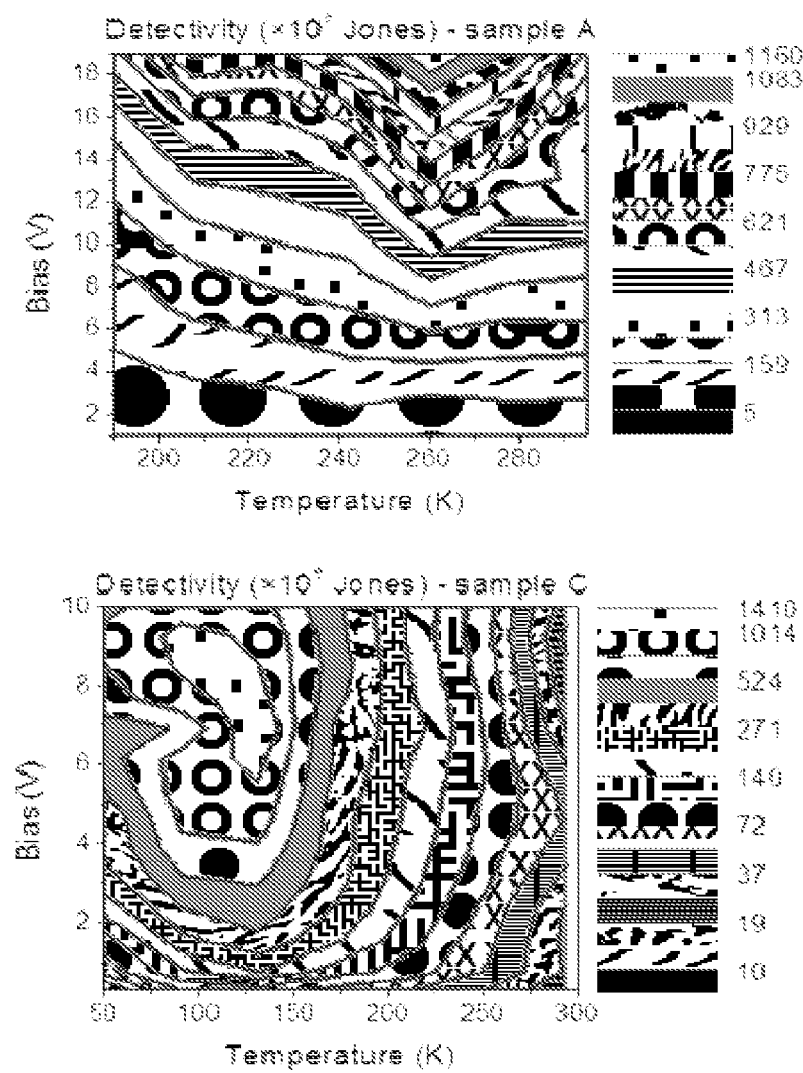
FIG. 15 is Map of the specific detectivity as a function of temperature and applied bias for sample A (top) and C (bottom).
Figure 16:
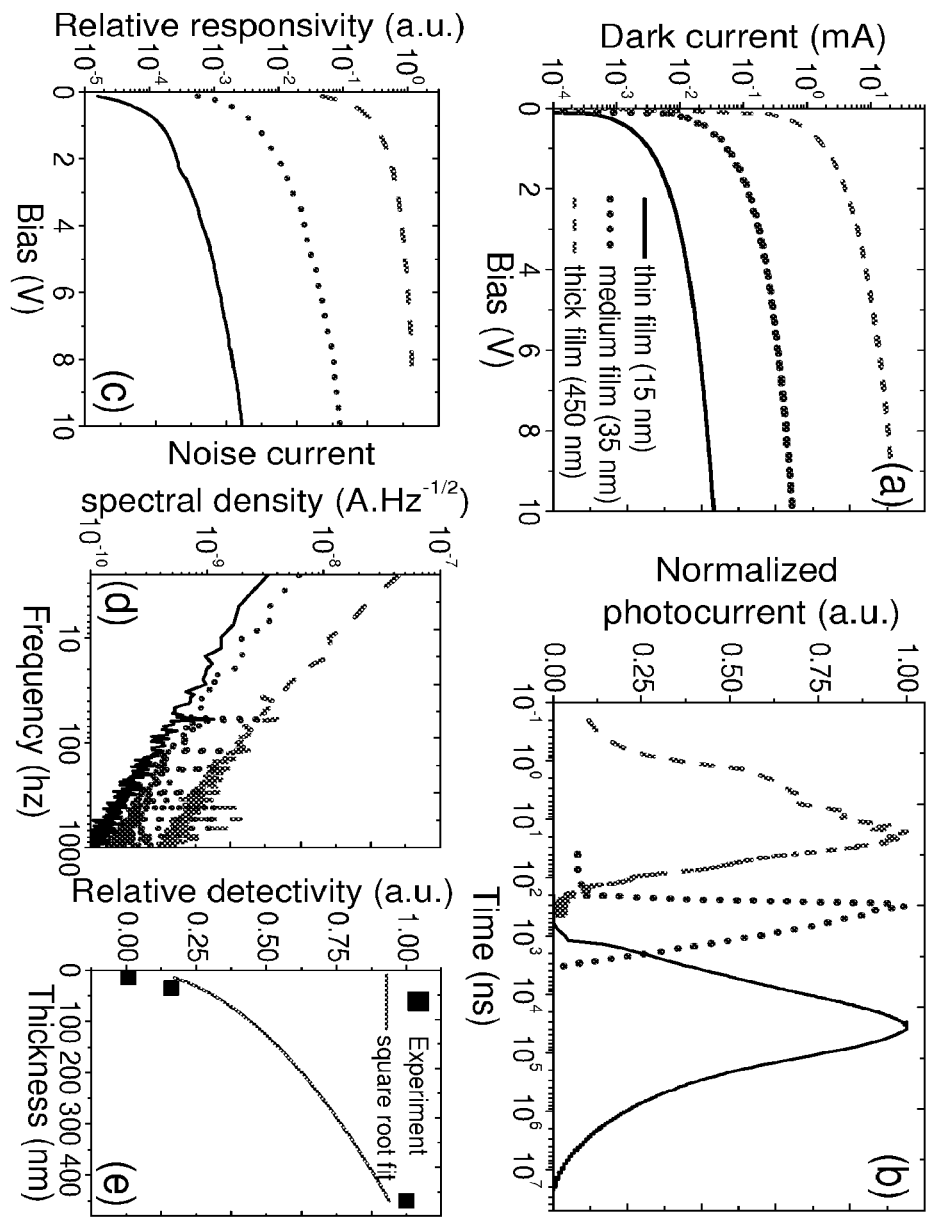
FIG. 16 (a) Dark current as a function of the applied voltage for three films. (b) Transient photocurrent in response to a short (10 ps) laser pulse of 1.06 µm wavelength, with 7 V bias (c) Relative responsivity as a function of the applied bias, (d) noise current spectral density, at a 7 V bias and (e) Detectivity (at 7V) as a function of film thickness for three films of different thicknesses based on the material of sample C. All measurements were conducted at room temperature. In the graphs a, b, c, d, the solid line is for the 15 nm film, the dashed line for the 35 nm-film and the dotted line for the 450 nm-film.

The spectral response of devices can be acquired with a step-scan Michelson interferometer. The SiC lamp output is mechanically chopped at 1.5 KHz. A Keithley 6487 picoammeter biases the sample and amplifies the current, which is then detected by a lock-in amplifier (PAR model 124). The analog signal from the lock-in as a function of the mirror displacement is Fourier transformed to provide the photocurrent spectra shown in FIG. 6. The spectrometer uses a CaF$_2$ beam splitter and operates up to ~8.5 microns. The spectra are not corrected for the lamp spectrum and the spectrometer transmission, and the response of a cooled HgCdTe (MCT) detector with 11 microns peak detectivity is shown as a comparison. Spectra normalized to the MCT response are shown in FIG. 10. The spectra demonstrated a cut-off at ~3 microns for the 3 μm sample device and ~5 microns for the 5 μm sample device in agreement with their optical absorption edge. Although the spectra do not change with applied bias, the cut-offs redshift with cooling, consistent with the shift of the bulk band parameters with temperature.

To determine the responsivity, a blackbody source at a short distance, ~5 cm, was used to reduce air absorption. The photon flux reaching the detector is given by equation (1).

$$\phi(T_{CN}, \alpha, \beta) = A_d \pi \cdot \cos\beta \cdot \sin^2\alpha \int_{\lambda_{min}}^{\lambda_{cutoff}} \frac{2c}{\lambda^4} \frac{1}{e^{\lambda k T_{CN}} - 1} d\lambda, \quad (1)$$

where $A_d$ is the area of the electrode, β is the angle between the detector normal and the light path and a the half angle viewed by the sample. The detector is mounted inside the cryostat. A well-defined $\lambda_{min}=1.7$ μm is provided by a Ge filter and $\lambda_{max}$ is the detector cut-off. With filament temperatures between 1400° C. and 2050° C., measured with an optical pyrometer (Leeds & Northrup Co), the photon flux reaching the detector is in the few 10$^{16}$ photons·s$^{-1}$ range, corresponding to an incident power of a few milliwatts. The estimated efficiency was calculated by equation (2):

$$I = I_{dark} + e\eta\phi \quad (2)$$

where η the external quantum efficiency (EQE), and φ the photon flux between the long and short cut-off wavelengths. The total current under two different incident photon flux is subtracted such that the EQE is giving by equation (3):

$$\eta = \frac{I_{total}(\phi_1) - I_{total}(\phi_2)}{e(\phi_1 - \phi_2)} \quad (3)$$

Figure 7:
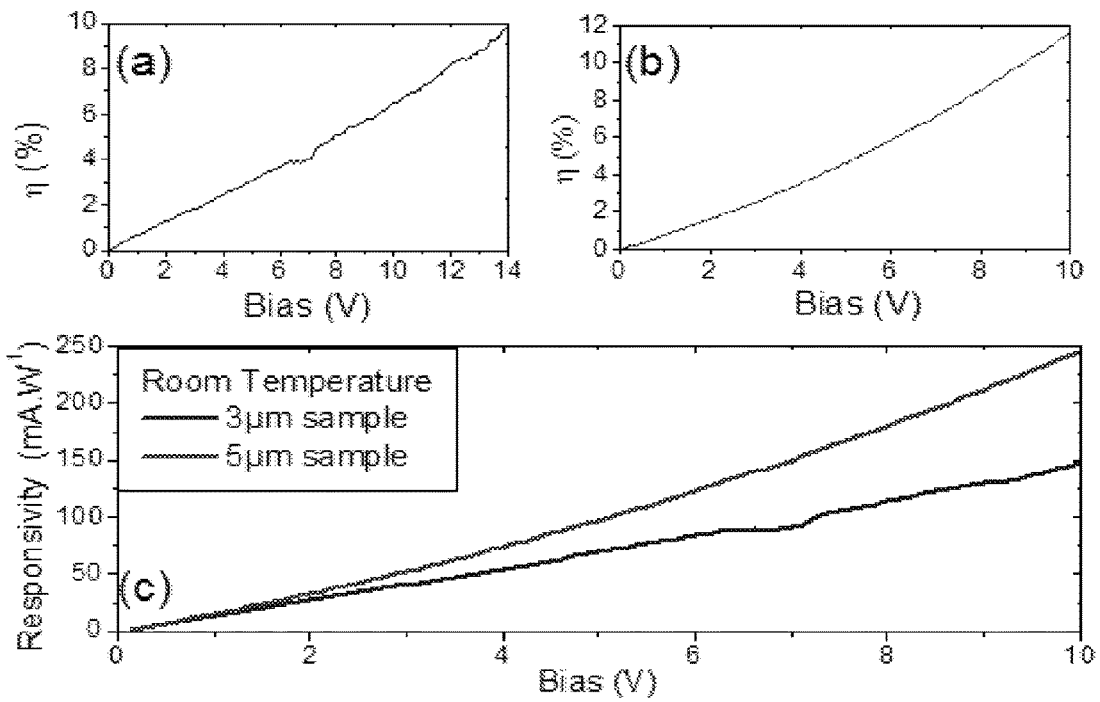
FIG. 7 External quantum efficiency as a function of the applied bias for the (a) 3 µm and (b) 5 µm samples, at room temperature. (c) Responsivity as a function of the applied bias for the two devices at room temperature, where the 3 µm sample is the bottom curve.

FIG. 7 shows the EQE as a function of applied bias at room temperature. The accuracy is limited to about a factor of 2. The 5 μm sample achieves 10% at 10 V and the EQE increases with applied bias.

The responsivity, $\mathfrak{R}$, is obtained by dividing the measured photocurrent by the calculated incident power between the Ge filter cutoff of 1.7 μm and the cut-off of the sample. The responsivity of two devices as a function of the applied bias is shown in FIG. 7c, showing a nearly linear dependence with bias. The 3 and 5 μm detector responsivities at 10 V bias are ~0.15 A·W$^{-1}$ and ~0.25 A·W$^{-1}$ respectively. Typical mid-wavelength IR (MWIR) detector responsivities are presented in Table 1. Surprisingly, the colloidal HgTe films compare well with quantum well infrared photodetectors (QWIP) and type II strained superlattice detectors, yet the herein described films are without any optimization.

TABLE 1

| Technology | Responsivity | Wavelength | Temperature | Bias or electric field |
|---|---|---|---|---|
| QWIP | 0.5 A/W | 4.1 μm | 150 | 20 kV · cm$^{-1}$ |
| InSb | 2.5 A/W | 1-5.5 μm | 77 K | |
| InSb | 3 A/W | 1-5.5 μm | 77 K | |
| SLS | 0.35 A/W | 4.3 μm | 77 K | 0 V |
| PbSe | 2500/7500 V/W | 2-5 μm | 295 K | |
| MCT | 10$^5$ V/W | 4 μm | 80 K | 10 V · cm$^{-1}$ |
| MCT | 200 V/W | 1-4.5 μm | 295 K | |
| | 1000 V/W | 1-4.8 μm | 270 K | |
| DTGS | 30/2440 V/W | 1-1000 μm | 298 K | — |
| 3 μm Sample | 0.12 A/W<br>750 V/W | 1.7-3 μm | 290 K | 10 V |
| 5 μm Sample | 15 mA/W<br>10 V/W | 1.7-5 μm | 290 K | 0.5 V |

This successful operation of the 5 micron sample CQD detector indicates that significant charge separation takes place within the exciton lifetime, in spite of the expected quenching by the ligand molecular vibrations. For example, the charge separation rate constant is sufficiently high to compete with the molecular vibrational quenching rate constant.

Figure 8:
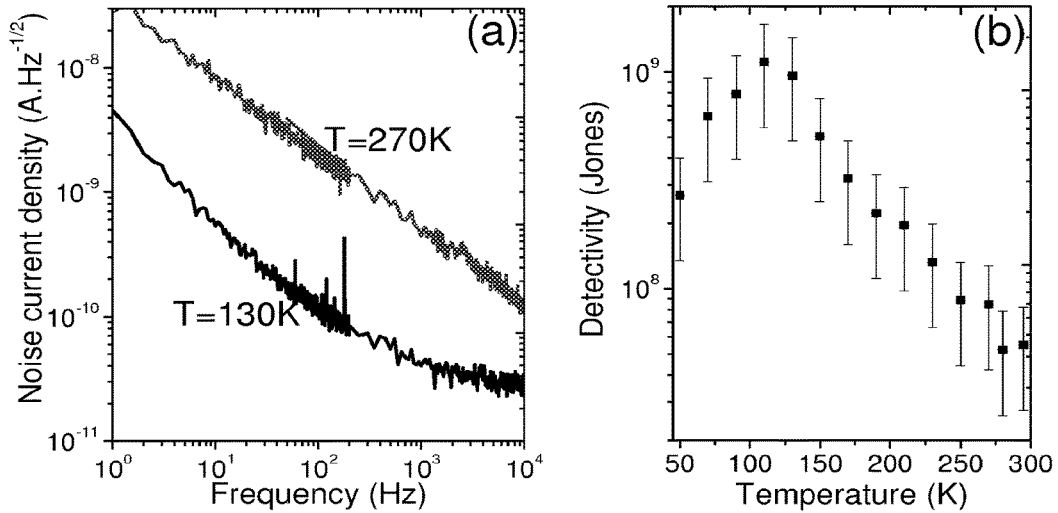
FIG. 8 (a) Spectra of the Noise current density for the 5 µm sample with 5 V bias. (b) Detectivity at 1 kHz as a function of temperature for the 5 µm sample with 5 V bias.

Finally, the noise current density $I_N$ is measured. FIG. 8(a) shows that the 1/f noise prevails at room temperature and low frequency and is well above the Johnson noise (9×10$^{-12}$ A·Hz$^{-1/2}$ at 295K). 1/f noise is problematic for applications but it is expected in granular films. A change in the film morphology can contribute to a decrease of the noise. The specific detectivity, given by $$D^* \approx \frac{\mathfrak{R}\sqrt{Area}}{I_N},$$

can be increased by lowering the temperature which more strongly reduces the noise than the responsivity. FIG. 8(*b*) shows the specific detectivity of the 5 μm sample with an optimum of ~2×10$^9$ Jones at 130K.

Notably, the HgTe nanoparticle films described herein are photoconductors in the MWIR, e.g., between 3 and 5 μm. They are stable in ambient conditions and have unexpectedly high detectivities in spite of the significant ligand vibrational absorption remaining in the film and the simple drop-cast film preparation.

In yet other embodiments, the herein described photoabsorptive layer can further comprise a plasmonic antenna. For example, the plurality of HgTe nanoparticles can be coupled (e.g., covalently, physiochemically, ionically, electrostatically, or electromagnetically) to a plasmon resonating particle or surface. In some examples, a plasmon resonating nanoparticle (e.g., nanocrystal or nanowire) is admixed with the plurality of HgTe nanoparticle and the admixture is used to form or forms the photoabsorptive layer. In other examples the HgTe nanoparticles are deposited onto a plasmon resonating surface, e.g., a surface comprising a material that yields a surface plasmon resonance. In various cases, the plasmon overlaps with the absorbance of the HgTe nanoparticles, for example with a wavelength in a range of 1.7 µm to 12 µm.

In some embodiments, the herein described photoabsorptive layer comprises the plurality of HgTe nanoparticles within an inorganic matrix. As used herein the inorganic matrix may have, if crystalline, larger crystal domains than the nanoparticles and, importantly, separates the nanoparticles. The inorganic matrix can be a glass, a solid, or a crystalline material. Additionally, the order of the array of nanoparticles can be short range or long range. Very dilute samples of nanoparticles in the inorganic matrix are expected to have lower relative ordering than concentrated samples wherein the nanoparticles can be ordered prior to and/or after the formation of the inorganic matrix.

In various embodiments, the HgTe nanoparticles described in the devices and methods of manufacturing devices described above can be supplemented or admixed with other nanoparticles, including for example, HgSe nanoparticles, PbSnTe nanoparticles, InAsSb nanoparticles, or mixtures thereof. That is the devices and methods of manufacturing devices described above can include nanoparticles that comprise or consist of, for example, HgTe, HgTe/HgSe, HgTe/PbSnTe, HgTe/InAsSb; HgSe, HgSe/PbSnTe, HgSe/InAsSb; PbSnTe, PbSnTe/InAsSb; or InAsSb.

Nanoparticles and devices comprising nanoparticles are further described in U.S. patent application Ser. Nos. 12/733,679, 11/327,655, 12/780,420, 12/728,181, 12/728,184, 12/506,233, 12/506,236, 12/426,854 and 12/852,328, and U.S. Pat. Nos. 7,326,908, 7,746,681, 7,742,322, 7,881,091, 7,923,801, and 7,773,404, all of which are incorporated herein by reference in their entirety.

Mid-Infrared Detection using Colloidal Quantum Dots (CQD)

Infrared thermal imagery mostly uses two ranges of atmospheric transparency, the 3-5 µm (Medium Wave Infrared, MWIR) and the 8-12 µm range (Long Wave Infrared LWIR) For these two ranges, mature technologies have been developed and infrared imagery now faces the two challenges of increasing the detector operating temperature and decreasing the cost of the focal plane array.

Figure 25:
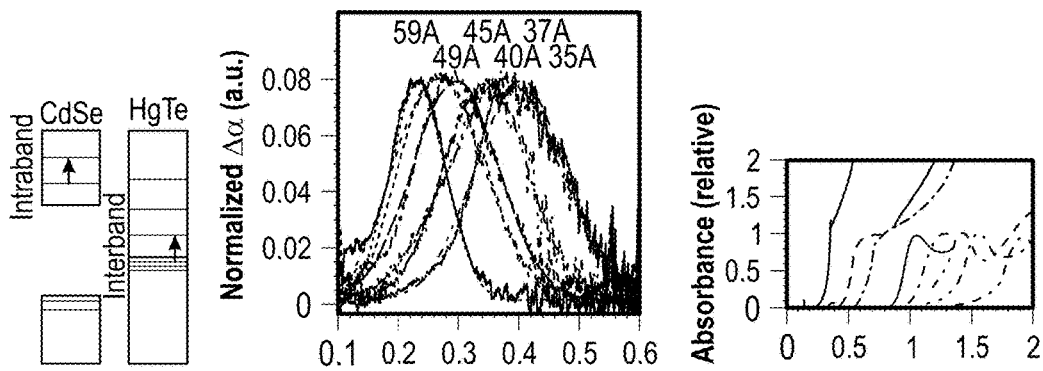
FIG. 25 shows on the left schematic the intraband and interband transitions; intraband transitions for CdSe nanocrystals of the indicated sizes are shown in the middle scheme, and interband absorption for HgTe nanocrystals are shown in the right scheme.

Quantum Dot Infrared Photodetectors based on molecular beam epitaxy (MBE) grown III-V semiconductors have been reported and can have improved performance compared to quantum well devices. CQDs offer several attractive features for imagery. The cost of films deposited from solution is reduced by orders of magnitude compared to epitaxial growth which may lead to significantly decreased costs. Since there is no need for epitaxial matching, the material can be deposited on any substrate including glassy or flexible material. Colloidal solution can be spin coated or inkjet printed. Using CQDs, infrared absorption can be accessed with interband or intraband transitions as shown in FIG. 25. Multicolor detectors can be achieved using two different sizes of nanomaterials. Because films of colloidal dots are close-packed, the absorption is much stronger than in Stranski-Krastanov grown quantum dot. Fully absorbing films remain thin and allow coupling with plasmonic structures.

Colloidal nanomaterials can also be challenging to prepare. Strategies for obtaining chemical stability and electronic passivation of the nanomaterials is not as mature as with epitaxial materials. Nonradiative processes are of a more diverse nature than in epitaxial system due to the large role of the interfaces. Electron transfer through a nanomaterial solid with many high barrier interfaces can be slow and lead to insulating behavior. The long term stability of nanomaterials can be uncertain given the large density of interfaces with atoms presenting different or weaker chemical binding. Electrical noise is can limit detection ability of the materials, and disordered granular systems are prone to high 1/f noise.

Colloidal nanomaterials have been researched for visible and near-IR applications such as biological labeling and solar energy. In these spectral ranges, they compete with small organic molecules and polymers. However, organic molecules cannot sustain mid-IR electronic transitions due to intramolecular vibrational relaxation. Thus, colloidal inorganic nanomaterials are uniquely capable to serve as solution-processable infrared electronic materials.

Chemical control of CQDs is improving. For example, core/shell systems allow an increasing degree of surface control. Molecular vibrations of ligands still quench the nanocrystals' electronic transitions in the mid-IR, but removal or replacement of organic ligands with inorganic matrices allow for better control. There has been progress in the device arena, since the observation of ohmic conductivity in monodispersed colloidal nanocrystal films nearly a decade ago, field-effect transistors of ever increasing mobilities, high sensitivity photoconduction, and improving photovoltaic performance.

The physical principles behind a colloidal quantum dot detector are the same as for a bulk semiconductor detector. The thermal generation of carriers, $G_{th}$ and the specific detectivity D*, $$G_{th} = n_{th}/(\alpha\tau)$$

$$D^* = \frac{\eta\sqrt{\alpha\tau}}{h\nu\sqrt{n_{th}}}$$

still characterize the ultimate performance of the detector. $n_{th}$ is the density of carriers at thermal equilibrium, $\alpha$ is the inverse of the absorption depth, $\eta$ is the quantum efficiency of photogenerated carriers, $\tau$ is the carrier lifetime, h is the Planck constant, and $\nu$ is the light frequency. These expressions assume that the dominant noise source is generation/recombination, and as discussed below, this is not obviously the case for the nanocrystal films.

With CQDs, the absorption $\alpha$ will be maximized since, without wishing to be bound by theory, the oscillator strength of bulk HgTe concentrates on the first excitonic transitions of the dots and the dots assemble in a close-packed arrangement. Therefore, while the weak absorption of QDIP is one of their major issues, CQDs provide some benefits.

The other parameter is the carrier lifetime $\tau$. Unlike in a bulk semiconductor there is no specific limit on the lifetime in a CQDs system. It can be very long leading to "ultrasensitive" near-IR PbS CQDs photodetectors. Indeed $\tau$ is related to the rates of the radiative and non-radiative recombination in the dots, as well as the hopping rates of the carriers between dots. Through chemistry, this can be adjusted at will, a limitation being the requirement on the response time of the detector.

As one example, if one considers bulk Mercury Cadmium Telluride (MCT), the limit on the lifetime is imposed by the Auger rate, $\gamma_{Abulk}n^2$, at the operating temperature. Auger may still take place in a very short time $\tau_A$, in a dot that has more than two carriers, typically on 100 ps time scales, but it is quenched if the carriers are on separate dots. Taking into account that electrons sample dots at a rate given by the hopping time, $\tau_h$, then the effective Auger rate in the film is given by $\gamma n^2 = n^2 (V_{dot})^2/(\tau_A + \tau_h)$. If the hopping time is very fast, this becomes $\gamma = (V_{dot})^2/\tau_A$. However, since previous studies in direct band gap semiconductor nanocrystals indicate that $\tau_A \gg (V_{dot})^2/\gamma_{Abulk}$, likely because of the smaller density of state in the dots, the Auger rate in the CQDs film will always be slower than in the bulk.

In CQDs films, the hopping time between dots is an essential time constant which is related to the mobility. Mobilities in films of colloidal dots are typically many orders of magnitude lower than in the bulk and depend essentially on the barrier material and thickness between the dots. It was discovered that, with nearly no effort to couple the dots electronically, mobilities of 0.1 cm²/Vs are readily achieved. This corresponds to a hopping time of ~0.5 ns.

To some degree this hopping time determines the responsivity both by its effect on the quantum yield and through the mobility. Charge separation is affected by this hopping time and the competing recombination time $\tau_r$, for radiative and nonradiative process. Therefore the quantum yield in Eq.1 can be written as $\eta = \tau_\rho + \tau_n$). For mid-IR CQDs, the radiative recombination is 100 ns or longer and therefore not a limitation, however, nonradiative processes can be much faster. For example nonradiative energy transfer to organic ligands shell can easily be in the picoseconds regime, but it can be lengthened to beyond a nanosecond by minimizing the infrared absorption of the ligands or interdot material. Mobilities of 0.1 cm²/s are not so low as to prevent high quantum yields in principle and excellent responsivities are expected from CQDs films.

Initial studies showed that at 1 kHz, 1/f noise dominates starting at temperatures of 100K and increases dramatically with higher temperatures.

Candidates for colloidal quantum dot absorbing in the mid-IR can be found among small gap binary and ternary semiconductors as well as semimetals. Among the binaries, PbSe is a popular IR colloidal dot. However, PbSe is limited by its bulk band gap of 0.27 eV at room temperature. SnTe has a slightly smaller gap and can also be synthesized as a highly monodisperse material. InSb is another binary material with a smaller gap at 0.19 eV (6.5 microns) but its synthesis as a colloidal material has not yet yielded good optical properties. Ternaries allow shifting the gap further such as for $Pb_{1-x}Sn_xTe$ which has a 0 eV gap for x=0.6. The colloidal synthesis of $Pb_{1-x}Sn_xTe$ showed that the gap of 7.5 nm diameter nanocrystals decreased from 0.7 eV to 0.3 eV as the Sn concentration reached ~50% and increased back to about 0.7 eV for pure SnTe. $InAs_xSb_{1-x}$ has a gap at 11.5 □m (0.11 eV) at x~0.3. In contrast to InSb, good quality, relatively monodispersed and near-IR luminescent InAs colloidal dots have been synthesized as well as core/shells. Starting from the InAs route, one could make $InAs_xSb_{1-x}$ colloidal dots. Semimetals can afford an IR gap if one considers quantum confinement. HgTe (~300 meV), elemental Bi (~40 meV) and Sb (~180 meV) have all moderate effective mass and are expected to exhibit confinement effects. In Sb nanowires, a gap is expected to open only around 9 nm diameter. Small pockets at the Fermi level suggest however that neither Bi nor Sb are widely tunable IR materials.

On the other hand, both HgSe and HgTe nanocrystals colloids have been reported in the literature with evidence of strong confinement and near-IR gaps. HgTe is better characterized as a colloidal quantum dot material. FIG. 25 shows the extraordinary quantum confinement (2 eV) achieved in that system. The initial "HgTe" nanocrystals emitting in the near IR were made by the partial replacement of Cd by Hg in CdTe nanocrystals. The aqueous synthesis of such small HgCdTe by Rogach, et al. led to efficient near-IR luminescence up to 2 □m. Their emission lifetime, in the 50 ns range, was much faster than for PbSe at a similar wavelength, reflecting the much larger oscillator strength (HgTe Kane parameter Ep ~20 eV) and weaker dielectric screening. Pure HgTe affords the same optical advantage while allowing better control a priori. Kovalenko, et al. introduced a synthetic method that led to a fairly clean band-edge up to 3 □m and PL tunable from 1.2 to ~3 microns. The Kovalenko, et al. strategy involved a low temperature reaction in aqueous solution to form small dots, followed by Ostwald ripening in nonpolar solvent. The Te source was in-situ electrochemically generated H2Te. This procedure can make dots with an IR gap up to 3 microns but in low yield.

The spectral range of colloidal HgTe has been further expanded as shown in FIG. 25. Using a higher reaction temperature, different solvent and a less reactive Te source, HgTe nanocrystals are synthesized with an absorption edge at 5 microns, and in good yield. There is no reason to expect 5 microns to be a limit. For surface passivation, R—S— is a soft nucleophile which binds strongly to the soft electrophile $Hg^{2+}$ and HgTe nanocrystals, and thus passivates the dots.

Figure 26:
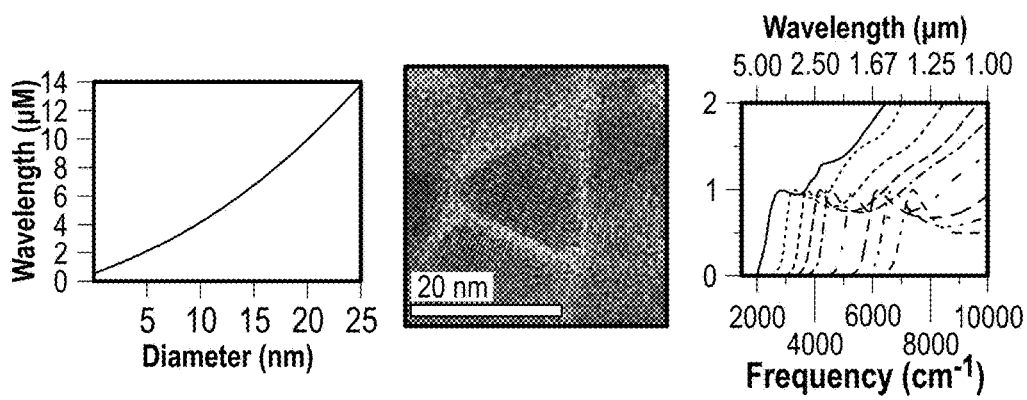
FIG. 26 shows left: tuning range expected for spherical HgTe dots; middle: TEM picture of HgTe nanoparticles with an absorption edge around 4 microns; and right: absorption spectra of mid-IR nanoparticles showing better resolved spectra than the solutions in FIG. 25.

HgTe nanocrystals can in principle tune across the mid and long-wave IR. For a spherical dot and an infinite confinement potential, using □/R for the momentum in the 2-band k.p approximation, the energy of the first transition as a function of radius R is given by $$E = \frac{E_g}{2} + \sqrt{\frac{E_g^2}{4} + E_p \frac{\hbar^2 \pi^2}{2mR^2}}$$

where Eg is the gap ~300 meV, Ep is the Kane parameter (~20 eV) and m is the free electron mass. The tuning range is shown in FIG. 26 and indicates that with particles up to 25 nm diameter, the MWIR and LWIR ranges will be covered. In a second generation of materials, improvement in the synthesis led to much more monodisperse particles as judged from the absorption features in FIG. 26 compared to FIG. 25. FIG. 26 shows a Transmission Electron Microscope (TEM) image of particles synthesized with an optical gap around 4 microns. The particles are not spherical, and rather angular, possibly tetrahedral. The spectra show a narrow absorption edge from 10 to 90% in less than 500 cm⁻¹, and an excitonic peak along with structure at higher energy.

Figure 27:
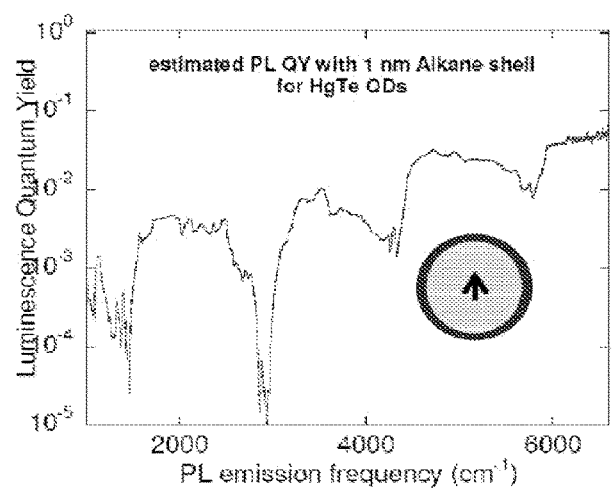
FIG. 27 shows estimated quantum yield of an emitting dipole as a function of the emission frequency. The emitting dipole is at the center of a dielectric sphere of 4 nm radius with the dielectric constant of HgTe, and surrounded by a thin shell of 1 nm thick alkane material.

The HgTe nanocrystals also fluoresce at their band edge 41 but the efficiency drops dramatically as the wavelength tunes to the mid-infrared. Without wishing to be bound by theory, one possible explanation for this effect is the very efficient near-field coupling between the emitting dipole and the weak infrared absorption of the ligand layers, which are used for solubility in organic solvent. Although a monolayer of such ligands can only absorb a minute amount of IR radiation in the far-field, with transmittance larger than 99.9%, the near-field coupling completely changes the situation leading to more than 99.9% of the emission of the dipole being absorbed. FIG. 27 shows the expected emission quantum yield for a dipole inside a sphere, taking into account the energy transfer to a 1 nm thick shell of alkane ligands. It is seen that the quantum yield drops precipitously in the mid-IR. Core/shells and/or IR transparent ligands or matrix can be used to improve the luminescence.

Figure 28:
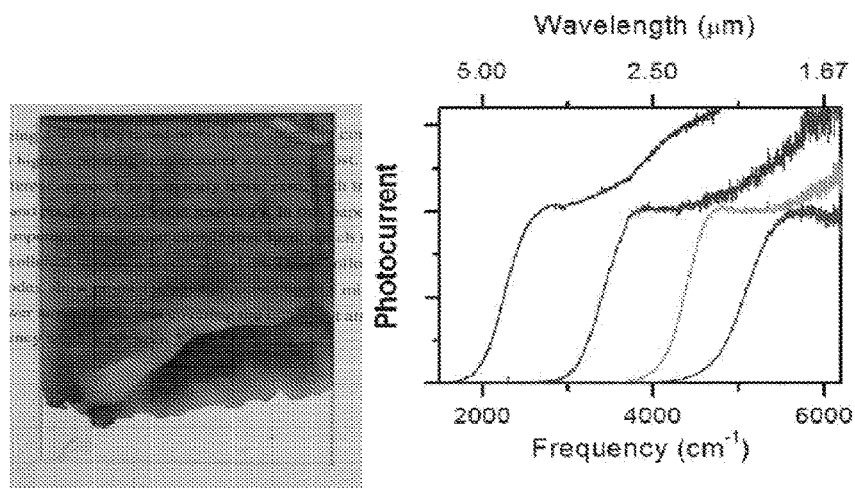
FIG. 28 shows left: picture of a drop cast film (~50 nm thick) of HgTe dots on a glass slide. Such semi-transparent films are already sufficiently thick to measure photocurrents with mid-IR excitation. Right: Photocurrent spectral response of films of HgTe colloidal dots of different sizes.

For conductivity and photoconductivity characterization, the HgTe colloidal dots are drop-cast as films on interdigitated electrodes. The conductivity and mid-infrared response photoconductivity of HgTe CQD solid films has been investigated as a function of temperature and particle size, and the cut-off wavelength has been tuned from the near infrared up to 7 μm. The measured responsivity already competes with devices such as QWIP or type II superlattices, and further improvements are expected with optimized thicker films. In films made of HeTe CQDs, the dark current showed a thermal activation with an energy close to half of the energy gap. This suggests that, at room temperature, most carriers are thermally generated. From the conductivity and the estimated carrier density, the mobility of 0.1-1 $cm^2V^{-1}s^{-1}$ was extracted. These mobility values have been confirmed by direct measurements where the carrier concentration was modulated by electrochemical gating. Other HgTe CQD materials which are more monodisperse exhibit sharper photoresponse edges as shown in FIG. 28. However, the films require ligand-exchange to provide mobilities of ~10-2 $cm^2/V/s$ which are still lower than in the first generation unprocessed material.

The temperature dependence of the responsivity is much weaker than that of the dark current, being essentially constant around room temperature and dropping only at lower temperatures. Without wishing to be bound by theory, this behavior may arise from already efficient charge separation at room temperature.

Figure 29:
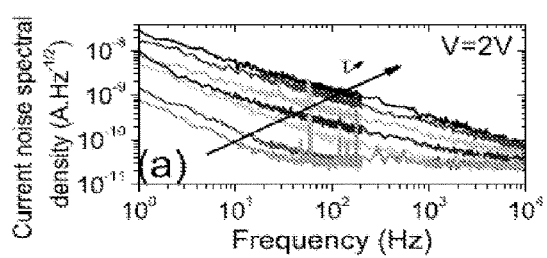
FIG. 29 shows left: current noise spectral density as a function of frequency for different temperatures, from 70 to 295K at a 2V bias. The electrode spacing is 10 microns. Right: Detectivity map as a function of temperature and bias for a sample with a room temperature cut-off of 5 microns (7 microns at 70K).
Figure 29:
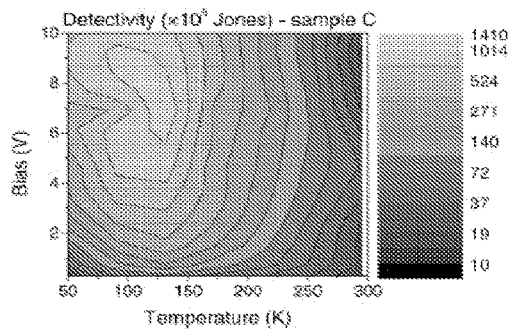

As shown in FIG. 29, the films show 1/f noise at low frequency. From an estimate of the carrier density, values of the Hooge's constant were a few orders of magnitude larger than for clean homogeneous metals. The 1/f noise decreases strongly with temperature leading to an optimum operating temperature. The best detectivity values for a 450 nm thick film are about $2 \times 10^9$ Jones at 130K and the fastest response times are below 100 ns at room temperature. A detectivity map is shown in FIG. 29. These results have been obtained with no processing of the films other than simply drop-cast from solutions.

Since the mobility and carrier generation efficiency are already high it seems that further improvement can come from the improved optical absorption edge, longer carrier lifetime, and reduced noise. Improved optical properties can also come from thicker films that absorb all the light, around a couple microns thick, and materials with improved monodispersivity. Higher monodispersivity will also reduce the concentration of large dots which may act as recombination centers. Reducing the noise will involve investigating the effect of film processing to possibly reduce a current crowding effect which maybe the source of excess 1/f noise.

Colloidal quantum dots have just started being investigated for their potential as mid-infrared detectors. The chemistry is still under development to improve the range of materials that can be synthesized. The responsivity and noise are likely to be extremely sensitive to the surface chemistry and the matrix material surrounding the dots, and there is a vast range of possible chemical processes that can be optimized. At present, detectivities between $10^{10}$ and $10^9$ Jones at 5 microns have been demonstrated while maintaining a fast response time at moderate cooling temperatures consistent with imaging operation, and these performances were obtained with simple drop-casting.

Optical Properties of HgTe CQDs

Room temperature photodetection with HgTe colloidal quantum films is reported between 2 and 5 microns for particles of sizes between ~5 and ~12 nm diameter, and photodetection extends to 7 microns at 80K. The size tuning of the absorption of HgTe colloidal quantum dots, their optical cross-section and the infrared absorption depth of films are measured. The tuning with radius is empirically given by $$\lambda_{BE}^{QD} = \frac{30.5}{\sqrt{1+(43/R_{QD})^2}-1}$$

where R is in nm. The optical cross-section of the colloidal dots at 415 nm is approximately proportional to their volume and given by $\sigma_{Hg}^{415} = 2.6 \pm 0.4 \times 10^{-17}$ $cm^2$ per mercury atom. The size-dependent optical cross-section at the band edge $\sim 1.5 \times 10^{-15}$ $cm^2$, is consistent with the expected oscillator strength of the quantum dots. The absorption depth of HgTe colloidal dot films is short, about 1 to 2 microns, which is an advantage for thin film devices. These properties agree rather well with the expectation from the k·p model. HgTe colloidal quantum dot thin films show a strong tuning with temperature with a large positive thermal shift between 0.4 meV/K and 0.2 meV/K decreasing with decreasing size within the size range studied and, wishing to be bound by theory, this is attributed primarily to electron-phonon effects.

Figure 30:
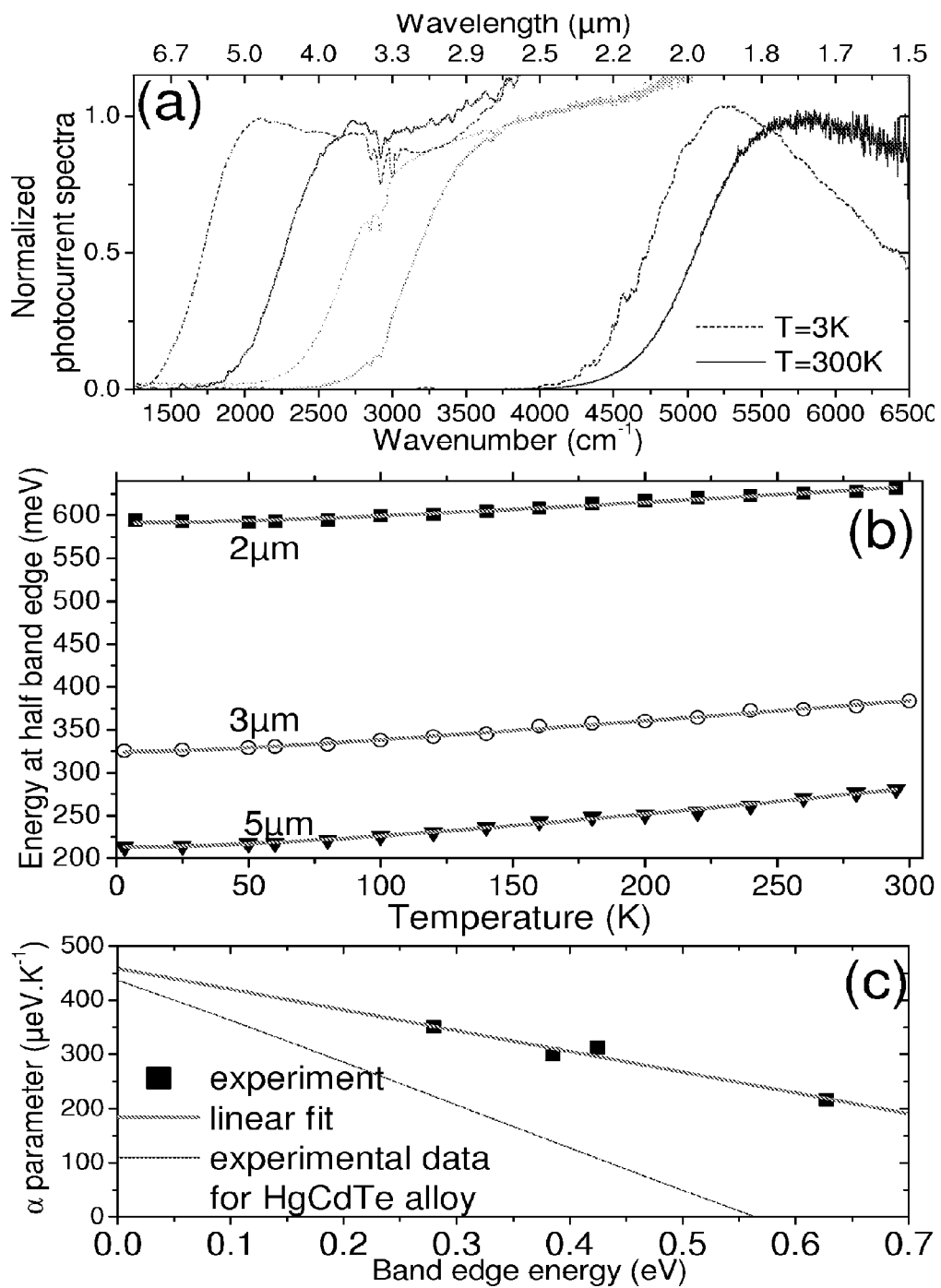
FIG. 30 shows normalized photocurrent spectra for three different sizes of HgTe nanoparticle at T=3K (dashed line) and at room temperature (solid line). The particle sizes are respectively 5 nm, 8 nm and 12 nm.

Colloidal nanomaterials are widely investigated for their potential in electronic and optical applications. Colloidal quantum dots (CQDs) provide specific opportunities with early developments focusing on the visible spectrum, primarily with the highly monodisperse cadmium chalcogenides. In the past decade, the near-infrared has become of interest, with the most studied materials being the lead chalcogenides, lately motivated largely by the hope of creating cheap photovoltaic thin films. With CQDs of the appropriate inorganic materials, the optical response can be extended into the mid-infrared which may lead to a lower cost alternative to the currently expensive infrared imaging technology. The mercury chalcogenides with a zero bulk band gap fulfill this opportunity and HgTe CQD films have recently enabled photodetection in the mid-IR. HgTe colloids have been synthesized for more than a decade but the materials remained restricted to the near-infrared with broad absorption edges. Recently, more monodisperse HgTe colloidal dots have been synthesized providing materials with excitonic transitions well into the mid-infrared. Disclosed herein are investigations into the optical properties of these new materials. FIG. 30 shows that the spectral photocurrent response of thin films of these HgTe CQD films is widely tunable with different sizes of particles. In addition, FIG. 30 shows that the spectral response also tunes with temperature, showing a strong redshift with decreasing temperature. With these new colloidal semiconductor materials, some of the optical properties are characterized, such as the size-tuning, the optical cross-sections in solution and the absorption depth of the films. The temperature tuning of the absorption is also of practical importance for detection, and the shift and its size dependence are investigated. The measured properties of the materials are compared to expectations based on the k·p model of bulk HgTe.

Figure 31:
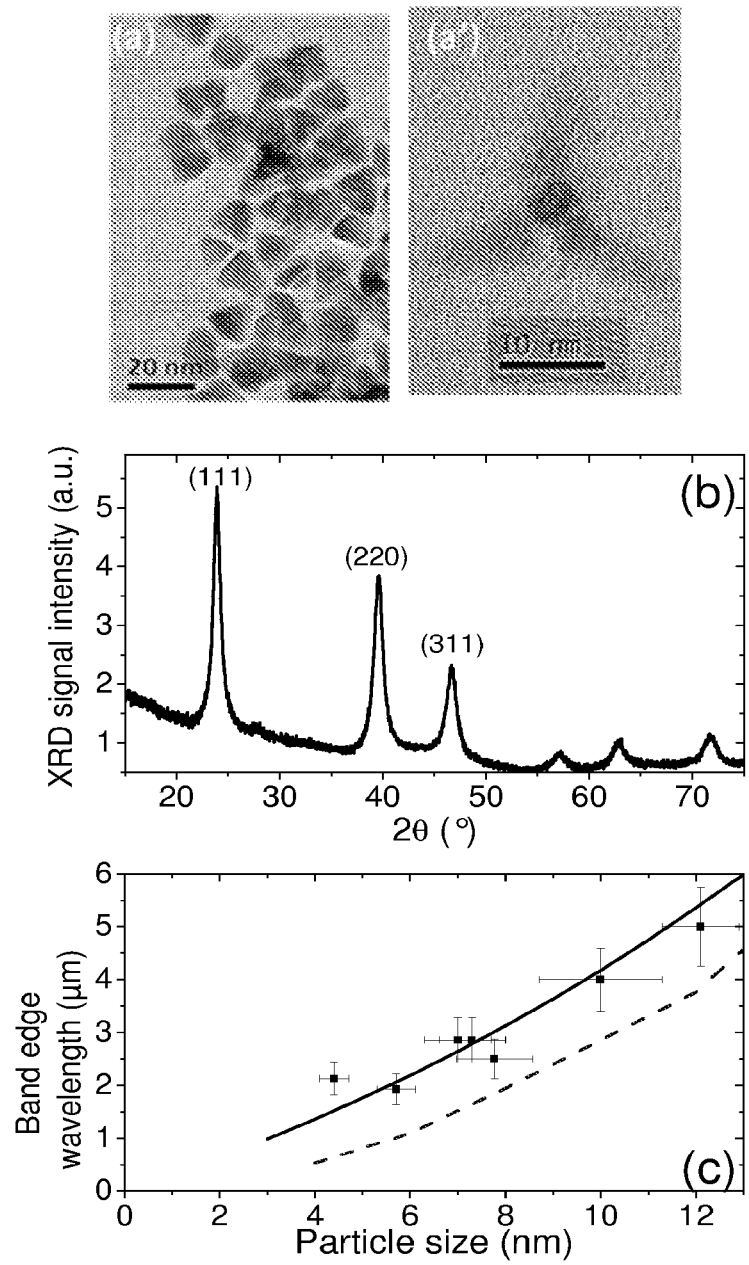
FIG. 31 shows (a) TEM images of HgTe nanoparticles of different size and shape. (b) XRD data of a film of HgTe nanoparticles. (c) Band edge wavelength as a function of particle size for spherical particles. The solid curve is the result obtained though the k·p calculation. For the experimental points, the particle size is estimated from transmission electronic microscopy. The dashed curve is the k·p result from Zhang et al., *J. Phys. D. Appl. Phys.*, 39:1815.

HgTe colloidal dots are synthesized as follows. Briefly, $HgCl_2$ and oleylamine are heated to 100° C. under vacuum for 1 hour. The mixture is then heated or cooled to the appropriate growth temperature for the target size (with higher temperature giving larger particles) and Te dissolved in trioctylphosphine is quickly added. Growth is stopped by quenching the solution into dodecanethiol in tetrachloroethylene and the particles purified by precipitation with methanol. Typical growth times are between 1 and 90 min, with longer times giving larger particles. Various shapes including spheres, tetrahedra or even multipods are obtained, as shown in FIG. 31(a). In spite of the variety of morphology, the HgTe CQDs are always zinc blende, as shown by X-ray diffraction (XRD) data in FIG. 31(b). The particle sizes studied here range from 5 to 12 nm as determined by TEM, which results in the band-edge energy tuning from the near to mid-IR. The size tuning of the absorption edge is shown in FIG. 31(c).

The sizes in FIG. 31(c) were determined from TEM images as an effective diameter. Due to the significant variation in particle shape and the tendency of the particles to aggregate, XRD was used to obtain another measure of size, using the Debye-Scherrer formula.

Figure 32:
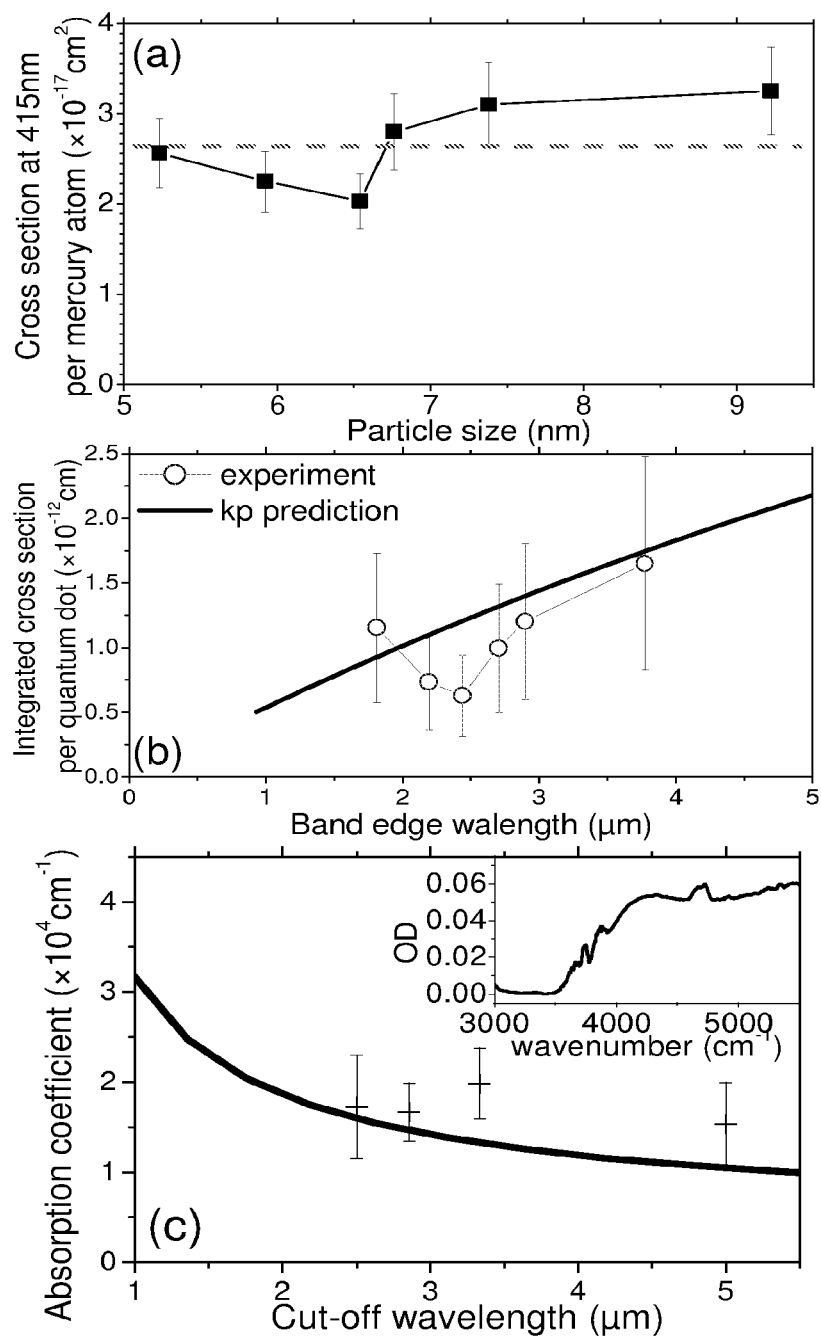
FIG. 32 shows (a) Cross-section per mercury atom as a function of particle size at 415 nm. The dashed line is the mean value (b) Particle band edge integrated cross-section as a function of band edge energy. The solid line is the k·p calculation. (c) Absorption coefficient of films of HgTe particles as a function of the cut-off wavelength. The solid line is the result of the k·p calculation and the experimental points are indicated. The inset shows an absorption spectrum of a 60 nm thick film.

The optical cross-sections of colloidal dots are useful to determine the concentrations of colloidal solutions but they have not been reported previously for HgTe dots. The cross-sections reported here are obtained by first measuring the absorption in the UV-visible and infrared and determining the QD size from XRD. Then the samples are acid digested and the mercury content is measured by titration with dithizone. As shown in FIG. 32(a), the cross section of the HgTe QDs per Hg atom at 415 nm is almost constant over 6 sizes of nanoparticles. Thus, $\sigma_{Hg}^{415}=2.6\pm0.4\times10^{-17}$ cm$^2$ was used to directly estimate the number of Hg atoms. Using the size determined from the XRD data to estimate the number of Hg atoms per particle, and the optical densities at 415 nm and at the first exciton peak or plateau, the band-edge particle cross-section, $\sigma_{QD}^{BE}$, is obtained. The band-edge particle cross-section is typically around $1.5\times10^{-15}$ cm$^2$.

From sample to sample, the band edge cross-section is affected by the size dispersion and the width of the exciton peak. This can be circumvented by using the integrated cross-sections $\sigma_{QD}^{int}$ which may then be compared to theoretical oscillator strengths. To get the integrated cross-section, the band edge is fitted to a Gaussian, giving $\sigma_{QD}^{int}=\sqrt{2\pi\gamma_{gauss}^2}\sigma_{QD}^{BE}$, where $\gamma_{gauss}$ is the Gaussian standard deviation in cm$^{-1}$ determined for each sample. The results are shown in FIG. 32(b). The integrated cross section are in the 10-12 cm range with rather large error bars resulting from the uncertainty in the value of $\sigma_{Hg}^{415}$, the uncertainty in the optical density at the band-edge, and the uncertainty in the volume of a quantum dot extracted from the XRD width.

For the absorption measurements of films as well as for photodetection, the CQD are dispersed in hexane/octane (9:1) and drop-cast, leading to homogeneous films of ~50 nm thickness. Then the films are immersed in a 1% solution of ethanedithiol in ethanol for 1 min. As the bulky ligands are exchanged with shorter ones, the molecular vibrational absorption is reduced, the absorption slightly red-shifted, the thickness of the film decreases and the optical dielectric constant increases. To make thicker films, the process is repeated several times. For absorption, the films are drop cast on polished silicon wafers and their thickness is measured using an ellipsometer (Gartner L116S), while the film optical density is measured using an FTIR (Nicolet magna IR 550), see the inset of FIG. 32(c). The optical absorption depth of the material is an important parameter for infrared detection. With self-assembled epitaxial quantum dots, a long standing problem has been the low volume fraction which results in a small absorption coefficient. Here the close-packed colloidal dots give short absorption depths between 1 and 2 microns as shown in FIG. 32(c). The absorption coefficient of the CQD material is in fact similar to the one reported for bulk HgTe ($5\times10^3$ cm$^{-1}$) and HgCdTe alloys with the same cut off wavelength, while the liquid processing of the colloidal quantum dots is a major advantage.

Figure 33:
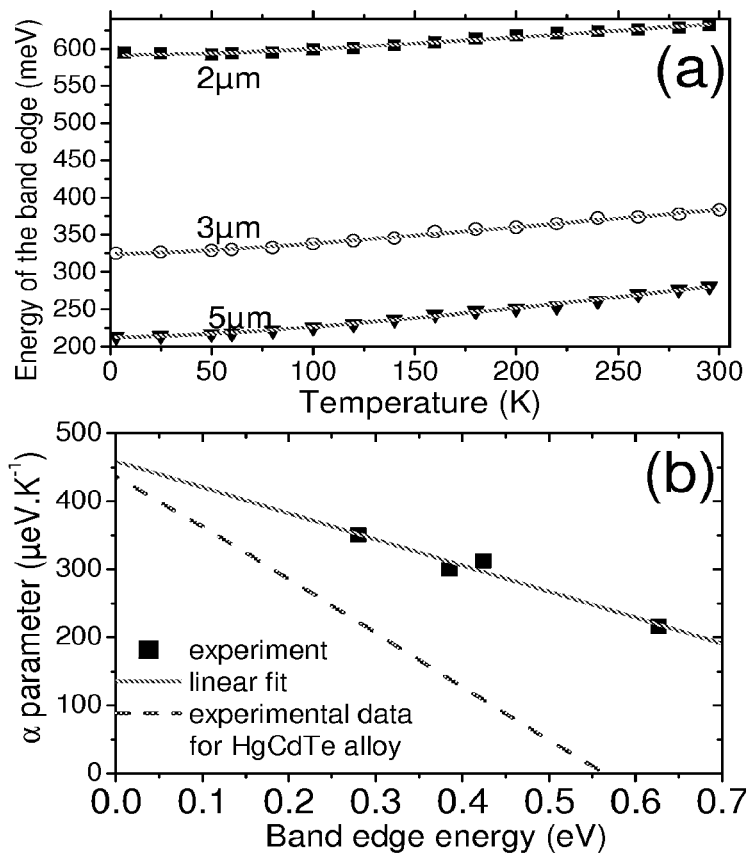
FIG. 33 shows (a) Evolution of the band edge energy as a function of temperature for the three samples. The band edge energy is taken as the point of half-height of the rising edge. Dots are the experimental points and solid lines are the Varshni's fit (b) A Varshni parameter as a function of the energy band edge of the CQD. A linear fit of the curve is also proposed to obtain an extrapolation of the bulk value (i.e. null band gap). The dotted line is $dE_G/dT$ as a function of the band gap value for HgCdTe with different Cd composition.

For photoconduction measurements, the films are drop-cast on to interdigitated planar Pt electrodes with 50 periods, 10 µm spacing and 5 mm length (ABTech IME 1050). The photocurrent spectra are acquired with a Nicolet Magna IR 550 FTIR and are normalized to the response of a DTGS detector. To investigate the effect of the temperature on the spectra, the samples are mounted on the cold finger of a closed cycle He cryostat. Photocurrent spectra for different sizes and temperatures are presented in FIG. 30. FIG. 33(a) shows the thermal shift of the band edge energy extracted from the photocurrent spectra shift. Using the empirical Varshni expression $$E_G(T) = E_G(T = 0 \text{ K}) + \frac{\alpha T^2}{\beta + T},$$

the data are fit with a value of β of 160K which is close to the bulk Debye temperature (120K). The slope in the higher temperature range gives the coefficient α, which is found to be size dependent as shown in FIG. 33(b). FIG. 33(b) also shows an empirical fit for HgCdTe alloys as a function of the bandgap and it is observed that the α parameter as a function of bandgap for HgTe CQDs follows a trend similar to that of HgCdTe. Extrapolating to zero bandgap from the data on HgTe CQDs gives +460 µeVK$^{-1}$, which is close to the expected bulk value for HgTe, seen in FIG. 33(b) as the y-intercept of the HgCdTe data. This is also within the range of other reported values, 270 to 850 µeVK$^{-1}$. The trend of smaller α with larger bandgap CQDs is similar to PbS and PbSe CQDs but is in contrast with CdSe CQDs, which show a thermal red-shift $$\left(\frac{dE_{BE}^{QD}}{dT} < 0\right),$$

independent of CQD size.

Early work comparing small HgTe quantum dots with calculations based on the effective mass and the negative band gap, predicted the Γ6 and Γ8 gap but not the optical gap. More recently k·p calculations of HgTe spherical nanocrystals have been reported, and include the mixing of the bands in the envelope functions. In FIG. 31c, a comparison with the experimental results indicates that prior work vastly overestimates the energies, in particular for the smaller sizes. The 8×8 k·p matrix leads to the numerically calculated band diagram shown in FIG. 34 for the range of k-vectors relevant to the particles in this study. Parameters used are summarized in Table 1. The photonic transition takes place between the two Γ8 bands in the HgTe CQD. FIG. 31(c) (solid line) shows the expected tuning of the first exciton with size for a spherical HgTe particle where the momentum, k, of electron and hole wavefunctions are given by k=π/R$_{QD}$ with R$_{QD}$ the nanoparticle radius. This neglect of band mixing in the envelope function should be appropriate in the limit of infinite confinement potential and nondegenerate band structure. The k·p size-tuning obtained here is in fair agreement with the experimental data within the errors in the size determination. The discrepancy with prior works might be due to the use of different parameters.

In particular prior works used EG=−0.3 eV while a room temperature value of EG=−0.15 eV was used here.

TABLE 1

| Quantity | Value |
|---|---|
| $E_G^{bulk}$ (T)<br>Bulk band gap | $-303 + \dfrac{0.63}{11+T}$ meV |
| $E_P$<br>Kane Energy | 18 eV |
| $\Delta_{SO}$<br>spin orbit coupling | 1 eV |
| A'<br>kp modeling coefficient | $-9.08 \times 10^{-39}$ J$^2$s$^2$ Kg$^{-1}$ |
| L'<br>kp modeling coefficient | $-2.97 \times 10^{-38}$ J$^2$s$^2$ Kg$^{-1}$ |
| M<br>kp modeling coefficient | $-2.48 \times 10^{-39}$ J$^2$s$^2$ Kg$^{-1}$ |
| N'<br>kp modeling coefficient | $-3.21 \times 10^{-39}$ J$^2$s$^2$ Kg$^{-1}$ |
| $\alpha_{dil}$<br>Linear thermal expansion coefficient | $5 \times 10^{-6}$ K$^{-1}$ (300 K) |
| $B_0$<br>bulk modulus | 42.3 GPa |
| $B_1$ | 4 |
| D<br>deformation potential | −5.6 eV |
| $\varepsilon_0$<br>Static dielectric constant | 20 |
| $\varepsilon_\infty$<br>Dielectric constant at optical frequency | 14 |
| $\hbar\omega_{LO}$<br>LO phonon energy | 17 ± 3 meV |
| ρ<br>the mass density | $8.1 \times 10^3$ kgm$^{-3}$ |
| $c_s$<br>The speed of sound | $2.14 \times 10^3$ ms$^{-1}$ |
| $e_{14}$<br>piezoelectric constant | 0.23 Cm$^{-2}$ |

For practical use, empirical relations between the band gap (in μm) and the particle size (in nm) is provided here, $$\lambda_{BE}^{QD} = \frac{30.5}{\sqrt{1+(43/R_{QD})^2} - 1} \text{ and} \quad (1)$$

$$R_{QD} = \frac{43}{\sqrt{\left(1 + 30.5/\lambda_{BE}^{QD}\right)^2 - 1}}$$

The choice of this fitting formula is based on the underlying k·p relations discussed below and provides a rational trend at small and large sizes—trends that would be missed in a multiparameter polynomial fit. The expression arises from simplifying further the k·p by considering that, the spin-orbit of HgTe is very large, and that k·p, restricted to the two bands Γ6 and Γ8, already captures the size/energy relationship rather well. The two-band k·p gives the light hole and conduction band as $$E_{C/LH} = -\frac{E_G}{2} \pm \sqrt{\frac{E_G^2}{4} + \frac{2}{3}E_P\frac{\hbar^2 k^2}{2m_0}} \quad (2)$$

with $m_0$ the free electron mass, $\hbar$ the reduced Planck constant, $E_P$, the Kane parameter, $E_G$ the bulk band gap ($E_{\Gamma 6}-E_{\Gamma 8}<0$) and the heavy hole energy is taken as non-dispersive $$E_{HH}=0 \quad (3)$$

The band edge transition is between the heavy hole and the conduction band and its energy is simply $$E_{BE}^{QD} = \frac{E_G}{2} + \sqrt{\frac{E_G^2}{4} + \frac{2}{3}E_P\frac{\hbar^2 k^2}{2m_0}} \quad (4)$$

This two-band analytical expression is the basis for the form used above as an empirical fit in equation 1. There have been no previous comparisons between theoretical and experimental absorption strengths for HgTe nanocrystals. Therefore use of the two-band k·p model to analytically get the oscillator strength as $$f = \frac{E_P}{2E_{BE}} \left( \frac{E_c^2}{2/3E_P\frac{\hbar^2 k^2}{2m_0}} + 1 \right)^{-1} \quad (5)$$

f varies from 5 to 10 in the size range studied here. The integrated (over wavenumber) absorption cross-section of the first exciton (with $k=\pi/R_{QD}$) is $$\sigma_{QD}^{int} = 2\frac{e^2}{4\varepsilon^\circ m_0 c^2 n}Sf \quad (6)$$

where n is the optical index of the solution (n~1.5 for TCE). S is the screening factor, $$S = \left(\frac{3\varepsilon_1}{\varepsilon_2 + 2\varepsilon_1}\right)^2,$$

where $\varepsilon_1$ and $\varepsilon_2$ are the dielectric constants of the medium (TCE, 2.25) and HgTe respectively, e° the vacuum permittivity. The factor of two in front of equation (6) accounts for the two electrons that lead to the first absorption in the QD. FIG. 32(b) shows the calculated integrated cross-sections, which are in fair agreement with the experimental data.

To estimate a theoretical absorption coefficient for the films, the integrated cross-section expression in equation (6) is used. A FWHM of 15% is assumed, which is consistent with the width of the band edge absorption, to get a peak cross-section $\sigma_{peak}$. The film absorption coefficient is then taken as $$\alpha_{abs} = \sigma_{peak} \frac{\eta}{V_{QD}}$$

where $V_{QD}$ is the volume of the particle. η is the filling factor of the film by the CQD taken equal to 0.64 assuming a random close packing of the CQDs. The effects of reflectivity on the internal field are ignored but the microscopic local field is accounted for using the film optical index determined by ellipsometry at 632 nm to be 2.5±0.1 after crosslinking. The calculated absorption depth shown in FIG. 32(c) is in fair agreement with the measured absorption. Overall, it is concluded that the k·p method gives a fair description of the size-tuning of the absorption edge of the nanoparticles, as well as the strength of the optical absorption.

Figure 34:
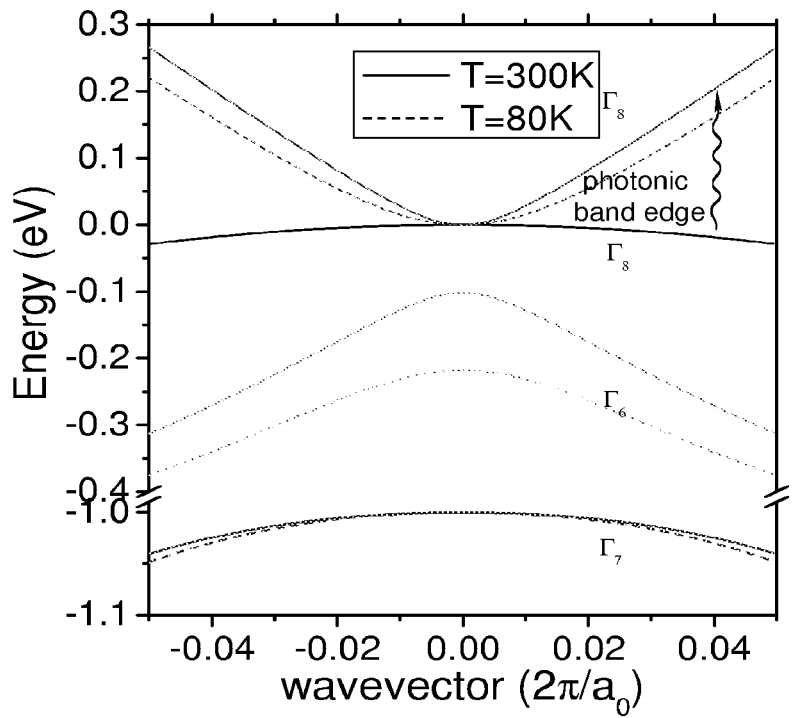
FIG. 34 shows a band diagram for bulk HgTe using the bulk band-gap at two different temperatures (300K and 80K).

The thermal shift of the absorption edge and its size dependence are shown in FIG. 33(b). Without wishing to be bound by theory, a possible origin of the size dependence is the change of the band structure as the gap energy changes. FIG. 34 shows the k·p bulk bands at 80 and 300 K with the empirical value of the gap at that temperature. FIG. 34 shows that k·p leads to a red shift with decreasing temperature of the right order of magnitude but wrongly predicts an increase in the thermal shift with smaller sizes (larger k), in contradiction to observations. There is no reasonable choice of parameters that could reverse the trend. Since the size dependence of the temperature effect is not accounted for by simply changing the bulk bandgap parameter in the k·p model, one needs to look at the source of the thermal shift.

In general, without wishing to be bound by theory, the thermal shift of the gap is assigned to electron-phonon effects and thermal lattice expansion such that $\Delta E_g(T) = \Delta E_g^{el-ph}(T) + \Delta E_g^{exp}(T)$. The thermal shift for CQDs can then be discussed by starting from the bulk properties and including the effect of confinement.

Thermal expansion: The effect of lattice thermal expansion is given by the deformation potential, D, and the lattice expansion, $\alpha_{dil}$, such that $$\frac{\Delta E_g^{exp}}{\Delta T} \sim 3\alpha_{dil} D.$$

For HgTe this is a red-shift of $-28$ µeV K$^{-1}$ which is small compared with the bulk bandgap shift, $+460$ µeV K$^{-1}$, such that it can be concluded that lattice expansion plays a negligible role in the thermal shift of HgTe CQDs.

Expansion of the lattice also changes the size of the particle, which in turn will affect the band gap energy as $$\frac{\Delta E_{BE}^{QD}}{E_{BE}^{QD}} \sim -2\frac{\Delta R_{QD}}{R_{QD}} = -2\alpha_{dil}\Delta T,$$

leading to $$\frac{\Delta E_{BE}^{QD}}{\Delta T} = -2\alpha_{dil} E_{BE}^{QD}.$$

With an 0.3 eV band edge as an example, the envelope expansion contributes only $-3$ µeV.K$^{-1}$ which is of totally negligible magnitude. Therefore, the lattice expansion does not account for the observed trend and magnitude of the size dependent thermal shift in HgTe CQDs.

Electron-phonon effects: The remaining cause can be a change of the band edge energy due to electron-phonon effects. At constant volume, the energy of the electron wavefunction changes with temperature due to the interaction with phonons and depends on the electronic and phonon density of states. While the literature varies in the assessment of the accuracy of the electron-phonon calculation in accounting for the bulk thermal shift of the mercury chalcogenides, it is in fact apparent that it is the dominant contribution. The electron-phonon coupling $H_{e-ph}$, treated in second order perturbation theory, leads to an energy shift of an occupied electronic state n of the general form $$\Delta E_n = -\sum_{n,n'} \frac{|\langle n', m \pm 1|H_{e-ph}|n, m\rangle|^2}{E_{n'} \mp \hbar\omega_{ph} - E_n} \quad (7)$$

where the phonon energy is $\hbar\omega_{ph}$, n' are empty states and m is a particular phonon occupation. For optical phonons, which are expected to dominate in the polar HgTe material, the coupling in the numerator in (1) has been shown to have a weak size dependence. However, the denominator in equation (7) increases with confinement, which will reduce the electron-phonon effect. Without wishing to be bound by theory, this suggests therefore that, for HgTe CQDs, the dominant contribution to the reduced thermal shift with decreasing sizes is the reduction of the electron-phonon interaction at large confinement.

In summary, presented herein are several optical properties of HgTe colloidal quantum dots that allow for tuning absorption from 2 to 5 microns at room temperature. The size-tuning and the optical cross-section of the colloidal solutions are reported. Films have also a strong optical absorption, suitable for thin film photodetectors. The observations agree rather well with calculations using the k·p model. The photodetection range of HgTe colloidal quantum dots thin films tunes with temperature and the shift is significant. For example, the detection cut-off tunes from 5 µm at room temperature to 7 µm at low temperature for the largest particles studied here. The magnitude of the shift decreases at small sizes and this is suggested to arise from the reduced electron-phonon coupling at higher confinement energy.

EXAMPLES

The following examples are provided to illustrate the invention, but are not intended to limit the scope thereof.
HgTe Nanoparticle Synthesis:
13 mg of tellurium powder (Aldrich, pieces, 99.999%, 0.1 mmol) are introduced with 2 mL of butanol (Aldrich 99.8%, anhydrous) and 0.1 mL of trioctylphosphine (TOP) (Aldrich, technical grade, 90%) into a 50 mL round bottom, three-neck flask. The mixture is heated to 90° C. under argon and agitated for 20 minutes in order to dissolve the tellurium, yielding a clear yellow solution. In the meantime, 32 mg of mercury(II) acetate (Aldrich 99.999%, 0.1 mmol) white powder, is dissolved in 2 mL of butanol and 2 mL pyridine (Aldrich, 99.98%, anhydrous), forming a clear, colorless solution. Solutions of Hg(II) salts are toxic and should be handled carefully. The mercury solution is rapidly injected into the flask, immediately forming an opaque black solution. The final particle size depends on the temperature of the flask at the time of injection of the Hg precursor, ranging from 0 to 90° C. with larger particles and faster reaction at higher temperatures. The particles grow over a period of several minutes, after which they precipitate and cannot be recovered. To monitor the progress of the reaction, 1 mL aliquots were removed at intervals and quenched by injection into a room temperature solution of 0.1 mL dodecanethiol (Aldrich, 98%) in 0.9 mL ethanol (Pharmco Aaper, 200 proof). The dodecanethiol quenches the reaction by binding the HgTe surface and Hg ion precursor. The solution is centrifuged and the precipitate is redispersed in tetrachloroethylene. Addition of acetonitrile (Aldrich, 98%, anhydrous) and centrifugation leads to a precipitate, which redisperses readily again in tetrachloroethylene. It was found that acetonitrile removes excess ligands with only one precipitation. The product tetrachloroethylene solution is centrifuged to remove insoluble material and is then stable in ambient storage for weeks. TEM sample preparation was done by drop-casting directly from a very dilute tetrachloroethylene solution.

Alternative HgTe Nanoparticle Synthesis:

HgTe nanoparticles were also synthesized as follows: 0.1 mmol of $HgCl_2$ in oleylamine is heated under argon to 70-100° C. for 90 minutes before 0.1 mL 1M Te in trioctylphosphine (TOP) is quickly injected. When the desired size is reached, indicated by the position of the optical absorption edge, the reaction is quenched by extracting into a room temperature solution of 1-dodecanethiol and TOP in tetrachloroethylene. The size can be tuned to larger particles and longer wavelength by lengthening the time of the reaction.

Preparation of Films Including HgTe Nanoparticles:

Films were made by simply drop-casting directly, in air, the concentrated tetrachloroethylene solution. Drying takes several minutes and was found to produce a more homogeneous film over the active area by elevating one end of the substrate slightly to advance the drying edge in one direction. From ellipsometry measurements of thin films on Si substrates, the dielectric constant of the films is 2.1. The film thicknesses are measured with an Atomic Force Microscope (Digital instruments Nanoscope IIIa) and a fine scratch made with a razor blade. Electrical measurements were performed on glass substrates with platinum interdigitated electrodes (ABTech IME 1050-4.9 mm length, 10 μm spacing and width, 50 periods). For noise measurements, the sample is placed in a Wheatstone bridge configuration powered by a battery. The bridge output is amplified (National Semiconductor LF356) and read by a spectrum analyzer.

The spectral responses are obtained with a home-made step-scan interferometer with gold mirrors. The beamsplitter is based on $CaF_2$ with a long wavelength cut-off of ~8.5 μm. The illumination is provided by a 1.0×3.8 mm SiC source element (Oriel 80030), heated to ~1200° C. The samples are mounted on the cold finger of a closed-cycle cryostat and surrounded by a cold shield.

Figure 17:
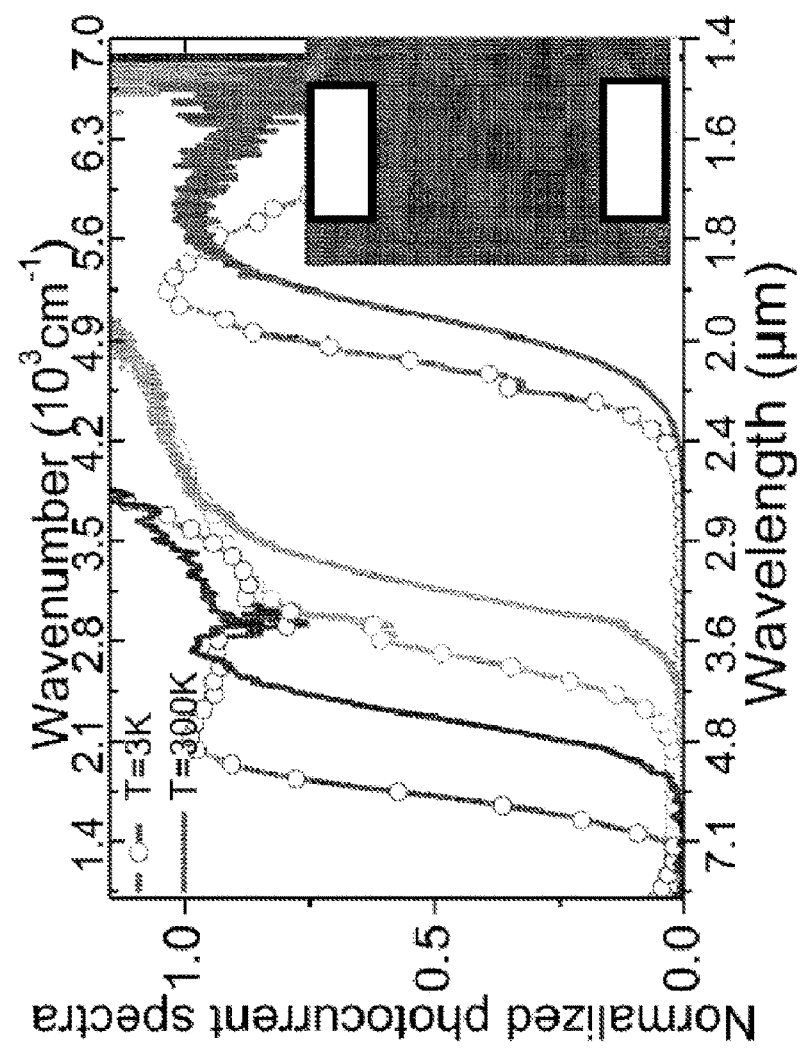
FIG. 17 shows the spectral response of thin films (having a thickness of less than 100 nm) of the inks of HgTe nanocrystals for three different sizes of the nanocrystals, measured at room temperature and at low temperature.

FIG. 17 shows the spectral response of thin films (having a thickness of less than 100 nm) of the inks of HgTe nanocrystals for three different sizes of the nanocrystals, measured at room temperature and at low temperature. Inset: picture of the HgTe ink dried on a 1"×2"glass slide. The resulting films are about 50 nm thick. The spectral responses are measured with such thin films deposited on small 1×3 mm patterned electrodes (shown schematically as white boxes). The film's time response is faster than 1 kHz.

Figure 18:
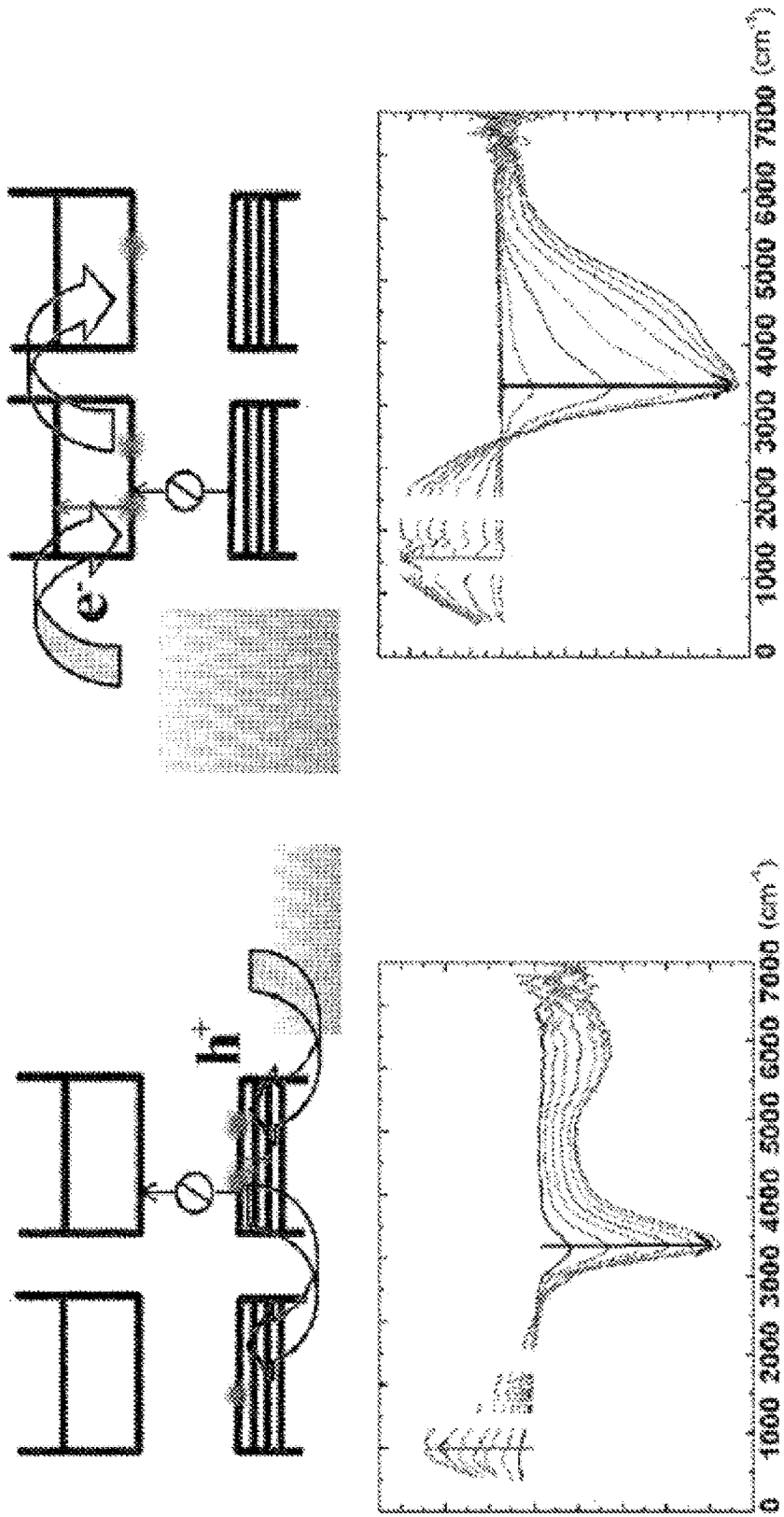
FIG. 18 shows the change of the optical spectra as the HgTe dots are doped p-type. The bleach (negative absorbance) takes place at the absorption edge of the dots, while an induced absorption takes place at the hole intraband transitions. Therefore, the sample looks cooler at 3 microns and hotter from 10 to 15 microns. The electrochromic effects of increasing hole injection (left) and electron injection (right) are shown for a film of HgTe dots with an infrared interband absorption at 3 microns (arrow position).
Figure 19:
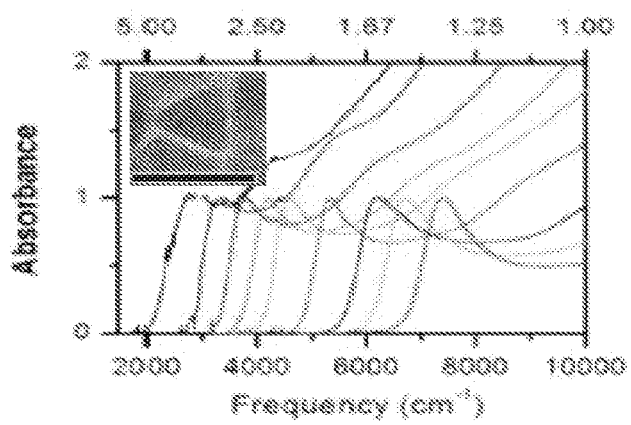
FIG. 19 shows the absorbance of a series of HgTe colloidal dots at different sizes. As the size increases, the frequency/absorbance spectrum shifts to the left.
Figure 20:
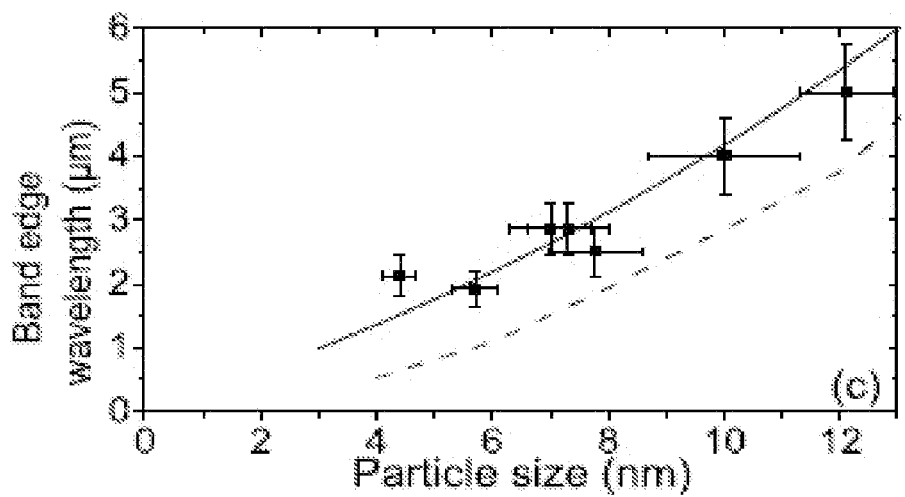
FIG. 20 shows the measured size and wavelength relationship of HgTe colloidal dots, where the solid line is the theoretical relationship for spherical quantum dots.
Figure 21:
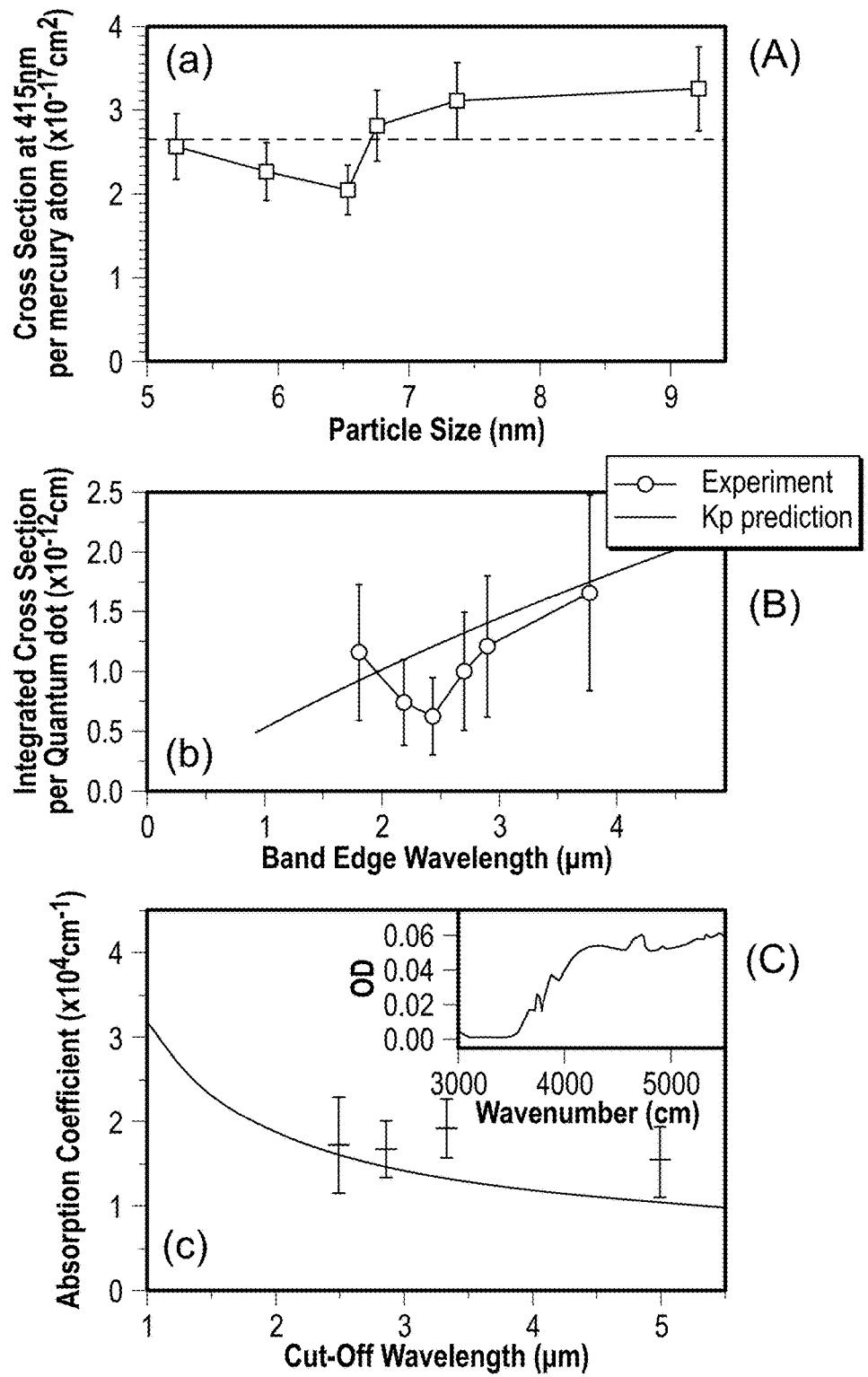
FIG. 21 (A) shows the absorption cross-section measured per atom of Hg, at 415 nm. It is approximately constant and can therefore be used to determine optically and simply the particle concentration knowing the optical density and the size of the particle. (B) shows the integrated oscillator strength of the band edge exciton of the HgTe dots. The line shows the theoretical expectation from a simple 2-bands k.p calculation. (C) shows the optical absorption coefficient for close packed films of HgTe dots. The solid line shows the theoretical expectation from a simple 2-bands k.p calculation. Films only a couple microns thick would absorb >95% of the light. The inset shows the optical absorption of a ~60 nm thick film.
Figure 22:
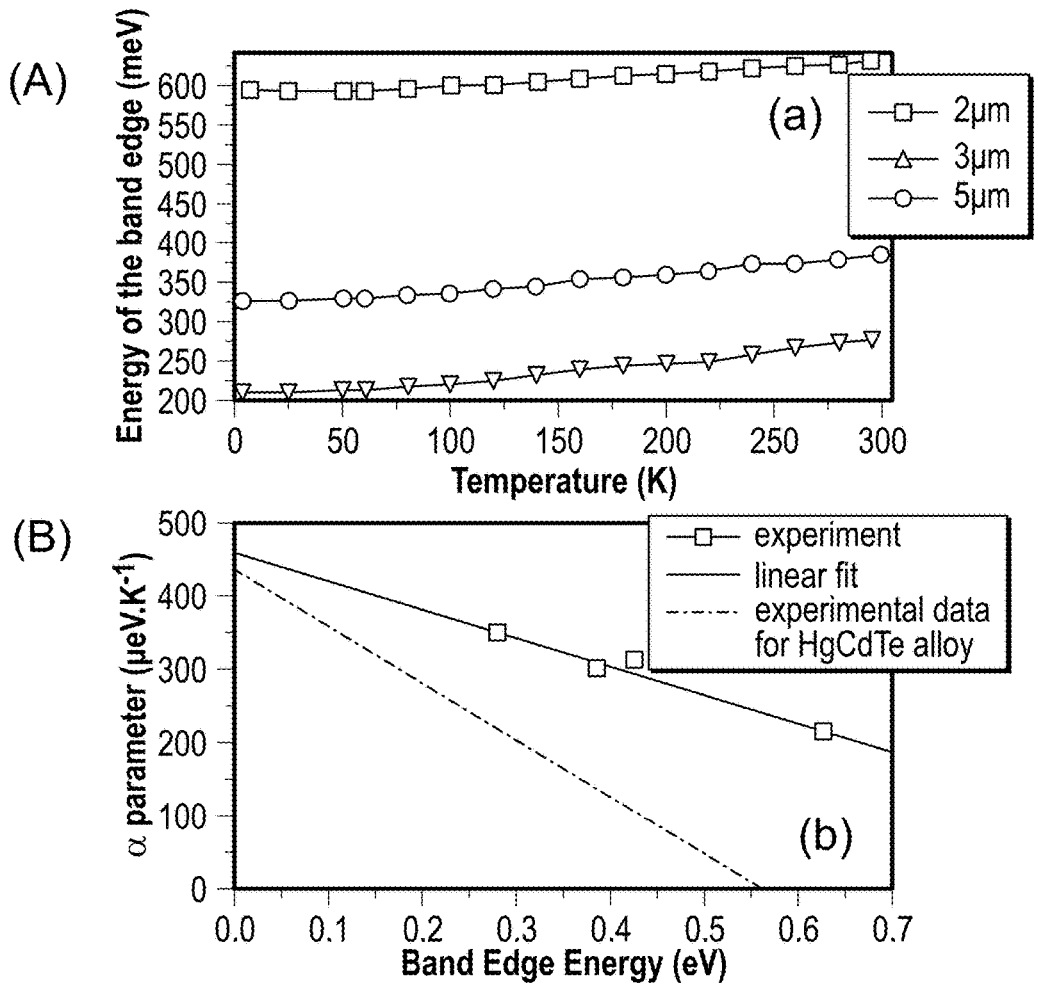
FIG. 22 (A) shows the tuning of the absorption edge with temperature for HgTe dots with a different absorption edge at room temperature. (B) shows the measured linear part of the tuning, from the FIG. 22A, as a function of the room temperature band edge energy.
Figure 23:
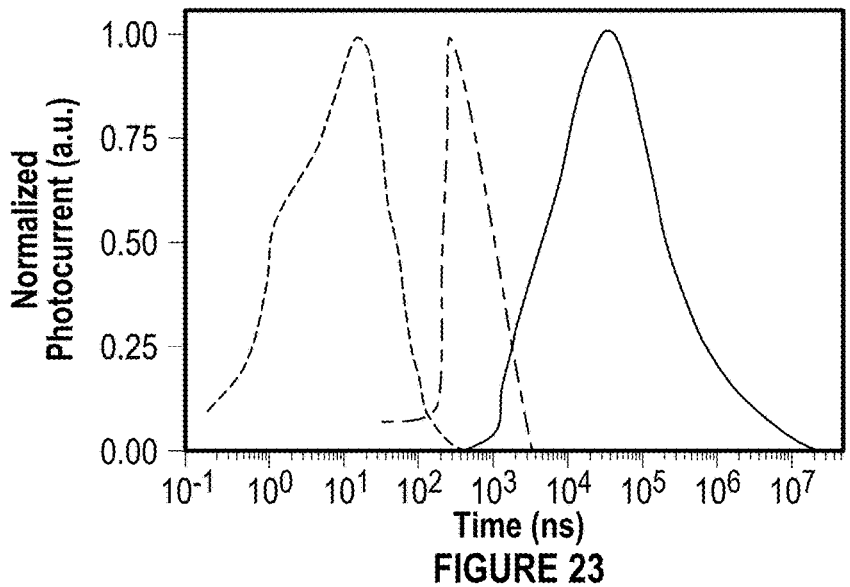
FIG. 23 shows the time response achieved with the detectors as disclosed herein. Here a time response of 100 ns, to an excitation by a 15 ps 1064 nm laser pulse (dashed curve) to less than 1 ms (solid curve) as a function of the resistance of the device.
Figure 24:
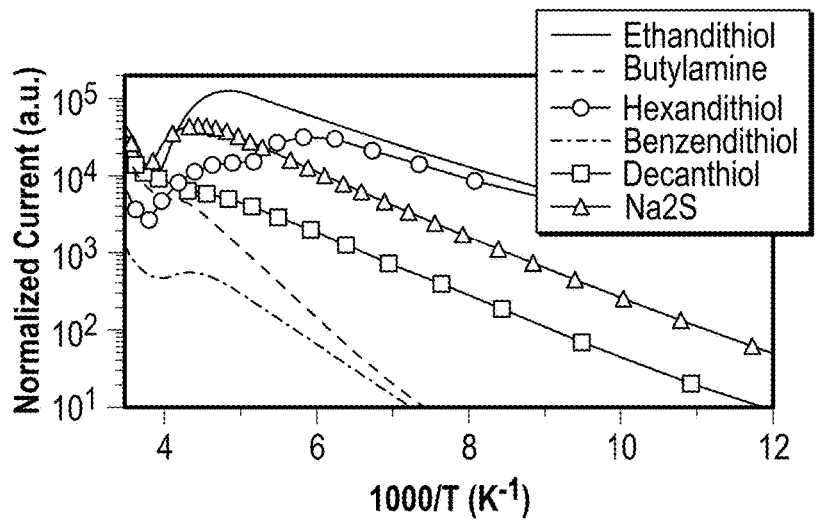
FIG. 24 shows examples of the effect of treatment of the films using different chemicals (ethanedithiol, butylamine, hexanedithiol, bexenedithiol, decanethiol, and $Na_2S$) on the resulting dark conductivity and its temperature dependence. In this case the films nanocrystal surfaces are simply exchanged with other surface active species in solution.

The carrier properties have been tested using FET and electrochemical charging. The electrochromic effect may be of some interest as well for cloaking. FIG. 18 shows the change of the optical spectra as the HgTe dots are doped p-type. The bleach (negative absorbance) takes place at the absorption edge of the dots, while an induced absorption takes place at the hole intraband transitions. Therefore, the sample looks cooler at 3 microns and hotter from 10 to 15 microns. The electrochromic effects of increasing hole injection (left) and electron injection (right) are shown FIG. 18 for a film of HgTe dots with an infrared interband absorption at 3 microns (arrow position).

FIGS. 19-24 show various properties of HgTe dots and films as described in the description of the drawings above.

The foregoing description is given for clearness of understanding only, and no unnecessary limitations should be understood therefrom, as modifications within the scope of the invention may be apparent to those having ordinary skill in the art.

What is claimed:

1. A photodetector comprising:
   a photoabsorptive layer comprising colloidal p-type doped or n-type doped mercury chalcogenide quantum dots having available intraband transitions for absorbing mid-infrared radiation with wavelengths of at least 3 μm via intraband absorption to generate a photoresponsive current;
   a first electrical connection and a second electrical connection, wherein the first and second electrical connections bridge the photoabsorptive layer; and
   circuitry configured to measure the photoresponsive current.

2. The photodetector of claim 1, wherein the colloidal p-type doped or n-type doped mercury chalcogenide quantum dots comprise colloidal mercury selenide quantum dots.

3. The photodetector of claim 2, wherein the circuitry is further configured to render the photoresponsive current as an image or an image file.

4. The photodetector of claim 1, wherein the colloidal p-type doped or n-type doped mercury chalcogenide quantum dots have available intraband transitions for absorbing mid-infrared radiation in the wavelength range of 3 μm to 5 μm via intraband absorption to generate the photoresponsive current.

5. The photodetector of claim 1, wherein the circuitry is further configured to render the photoresponsive current as an image or an image file.

6. The method of claim 1, wherein the colloidal mercury chalcogenide quantum dots are colloidal p-type doped mercury chalcogenide quantum dots.

7. A device comprising:
   a photoabsorptive layer comprising colloidal p-type doped or n-type doped mercury chalcogenide quantum dots, wherein the colloidal p-type doped or n-type doped mercury chalcogenide quantum dots have available intraband transitions for absorbing mid-infrared radiation with wavelengths of at least 3 μm via intraband absorption to generate a photoresponsive current.

8. A method of detecting infrared radiation using a photodetector comprising: a photoabsorptive layer comprising colloidal p-type doped or n-type doped mercury chalcogenide quantum dots, wherein the colloidal p-type doped or n-type doped mercury chalcogenide quantum dots have available intraband transitions for absorbing mid-infrared radiation with wavelengths of at least 3 μm via intraband absorption to generate a photoresponsive current; a first electrical connection and a second electrical connection, wherein the first and second electrical connections bridge the photoabsorptive layer; and circuitry configured to measure the photoresponsive current, the method comprising:
   exposing the colloidal p-type doped or n-type doped mercury chalcogenide quantum dots to mid-infrared radiation, wherein the colloidal p-type doped or n-type doped mercury chalcogenide quantum dots absorb the mid-infrared radiation with wavelengths of at least 3 μm via intraband transitions and generate a photoresponsive current; and
   measuring the photoresponsive current with the circuitry.

9. The method of claim 8, wherein the colloidal p-type doped or n-type doped mercury chalcogenide quantum dots comprise colloidal mercury selenide quantum dots.

10. The method of claim 9, wherein the circuitry is further configured to render the photoresponsive current as an image or an image file, and the method further comprises rendering the photoresponsive current as an image or an image file.

11. The method of claim 8, wherein the colloidal p-type doped or n-type doped mercury chalcogenide quantum dots absorb mid-infrared radiation in the wavelength range of 3 µm to 5 µm via intraband absorption to generate the photoresponsive current.

12. The method of claim 8, wherein the circuitry is further configured to render the photoresponsive current as an image or an image file, and the method further comprises rendering the photoresponsive current as an image or an image file.

13. The method of claim 8, wherein the colloidal mercury chalcogenide quantum dots are colloidal p-type doped mercury chalcogenide quantum dots.

* * * * *

UNITED STATES PATENT AND TRADEMARK OFFICE
CERTIFICATE OF CORRECTION

PATENT NO. : 10,290,753 B2
APPLICATION NO. : 15/062418
DATED : May 14, 2019
INVENTOR(S) : Philippe Guyot-Sionnest et al.

Page 1 of 1

It is certified that error appears in the above-identified patent and that said Letters Patent is hereby corrected as shown below:

In the Specification

<u>Column 1, Lines 19-23:</u>
Delete the phrase:
"This invention was made with governmental support under grants from the U.S. National Science Foundation (NSF) (DMR-070626) and U.S. Department of Energy (DOE) (DE-FG02-06ER46326). The government has certain rights in the invention."
And replace with:
--This invention was made with government support under grant number DMR0706268 awarded by the National Science Foundation and grant number DEFG02-06ER46326 awarded by the Department of Energy. The government has certain rights in the invention.--.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*